United States Patent
Yang et al.

(10) Patent No.: US 12,063,766 B2
(45) Date of Patent: Aug. 13, 2024

(54) VERTICAL STATIC RANDOM ACCESS MEMORY AND METHOD OF FABRICATING THEREOF

(71) Applicant: Taiwan Semiconductor Manufacturing Company, Ltd., Hsin-Chu (TW)

(72) Inventors: Chih-Chuan Yang, Hsinchu (TW); Kuo-Hsiu Hsu, Taoyuan County (TW); Chia-Hao Pao, Kaohsiung (TW); Shih-Hao Lin, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 236 days.

(21) Appl. No.: 17/514,118

(22) Filed: Oct. 29, 2021

(65) Prior Publication Data
US 2022/0352179 A1    Nov. 3, 2022

Related U.S. Application Data

(60) Provisional application No. 63/180,882, filed on Apr. 28, 2021.

(51) Int. Cl.
| | | |
|---|---|---|
| G11C 11/412 | (2006.01) | |
| G11C 11/417 | (2006.01) | |
| H01L 27/092 | (2006.01) | |
| H10B 10/00 | (2023.01) | |

(52) U.S. Cl.
CPC ............ *H10B 10/12* (2023.02); *G11C 11/412* (2013.01); *G11C 11/417* (2013.01); *H01L 27/092* (2013.01)

(58) Field of Classification Search
CPC ..... H10B 10/12; G11C 11/412; G11C 11/417; H01L 27/092; H01L 29/0676; H01L 29/78642
See application file for complete search history.

(56) References Cited

U.S. PATENT DOCUMENTS

| | | | |
|---|---|---|---|
| 2019/0096475 A1* | 3/2019 | Li | G11C 7/1006 |
| 2020/0161311 A1* | 5/2020 | Pille | H10B 10/12 |

* cited by examiner

*Primary Examiner* — Walter H Swanson
(74) *Attorney, Agent, or Firm* — HAYNES AND BOONE, LLP

(57) ABSTRACT

A four times contacted poly pitch (4CPP) static random-access memory (SRAM) cell layout is disclosed that forms six SRAM transistors from one OD region and four poly lines at a frontside of a substrate and provides a double-sided routing structure for word lines, bit lines, and/or voltage lines. For example, a vertical SRAM is disclosed that stacks transistors, vertically, to facilitate scaling needed for advanced IC technology nodes and improve memory performance. The vertical SRAM further includes a double-sided routing structure, which facilitates placement of bit lines, word lines, and voltage lines in a backside metal one (M1) layer and/or a frontside M1 layer to minimize line capacitance and line resistance.

20 Claims, 24 Drawing Sheets

US 12,063,766 B2

VERTICAL STATIC RANDOM ACCESS MEMORY AND METHOD OF FABRICATING THEREOF

This is a non-provisional application of and claims benefit of U.S. Provisional Patent Application Ser. No. 63/180,882, filed Apr. 28, 2021, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased resistance and exhibiting increased capacitance, which presents performance, yield, and cost challenges. It has been observed that these higher resistances and/or higher capacitances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Performance of advanced memories, such as static random-access memory ("SRAM"), is especially sensitive to these delays, where the advanced memories are requiring ever faster speeds (e.g., fast write/read). Accordingly, although existing MLI features for memory-based ICs and their interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
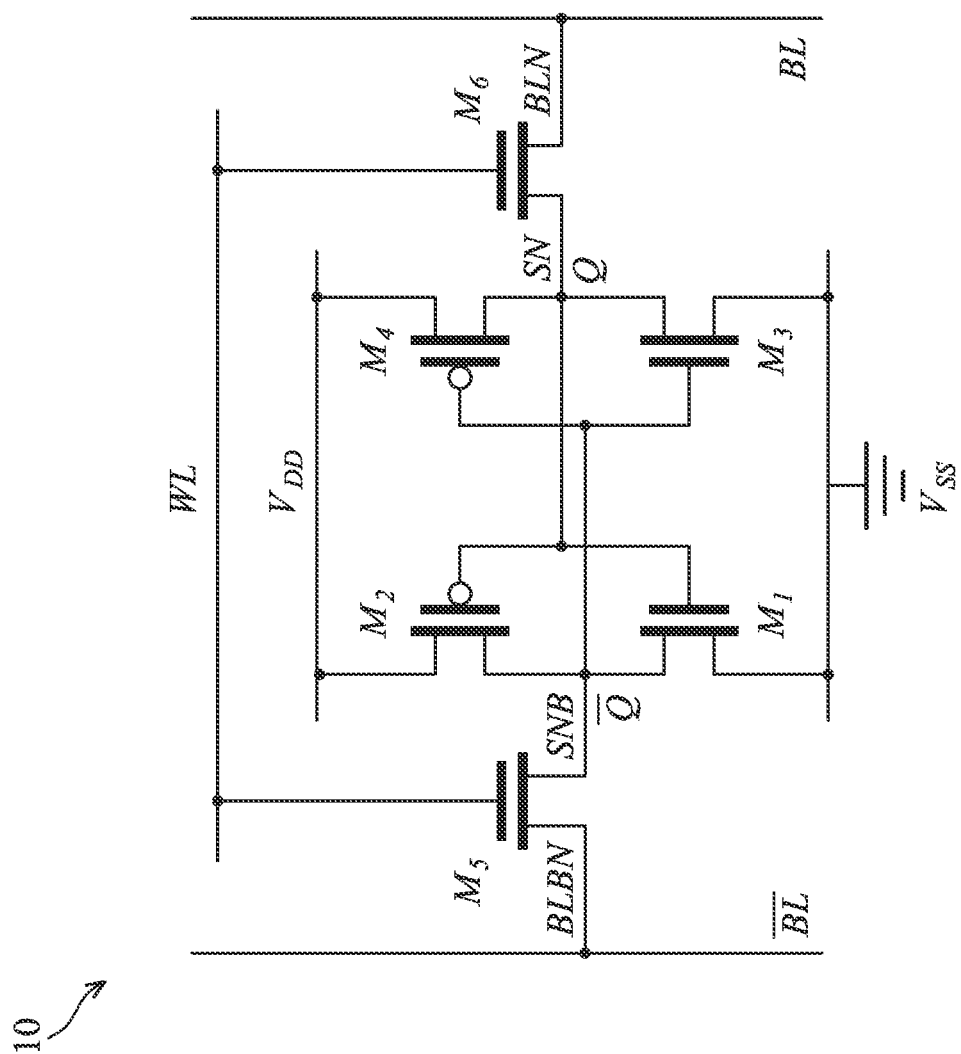
FIG. 1 is a circuit diagram of a memory, such as a static random-access memory (SRAM), according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure relates generally to integrated circuit (IC) devices, and more particularly, to memory-based IC devices. In some embodiments, the present disclosure provides configurations of static random-access memory (SRAM) that can facilitate scaling needed for advanced IC technology nodes and improve memory performance.

An SRAM can include six transistors: a pass-gate transistor PG-1, a pass-gate transistor PG-2, a pull-up transistor PU-1, a pull-up transistor PU-2, a pull-down transistor PD-1, and a pull-down transistor PD-2, which are electrically connected to a word line (WL), a bit line (BL), a bit line bar (BLB), a first voltage line (VDD), and a second voltage line (VSS). Typically, SRAM is fabricated according to a two times contacted poly pitch (2CPP) SRAM cell layout that forms the six SRAM transistors from four OD (active) regions/lines and two poly (gate) lines at a frontside of a substrate. CPP refers to a distance between contact poly lines. In such embodiments, word line, bit line, bit line bar, first voltage line, and second voltage line are located over the six transistors and formed in metallization layers of a multilayer interconnect (MLI) structure formed over the frontside of the substrate, such as in a bottommost, metal one (M1) layer of the MLI structure. In an effort to scale, SRAM is sometimes fabricated according to a four times contacted poly pitch (4CPP) SRAM cell layout that forms the six SRAM transistors from two OD regions and four poly lines at a frontside of a substrate. In such embodiments, word line and first voltage line are located over the six transistors and formed in metallization layers of an MLI structure formed over the frontside of the substrate, while bit line, bit line bar, and second voltage line are located under the six transistors and formed in metallization layers of an MLI structure formed over the backside of the substrate. The 4CPP-2OD SRAM cell layout can reduce SRAM cell area, SRAM cell density, and/or SRAM cell footprint, along with reducing resistance and/or capacitance by allowing for wider word lines, bit lines, and voltage lines, compared to the 2CPP SRAM cell layout. However, both the 2CPP SRAM cell layout and the 4CPP-2OD SRAM layout position transistors laterally adjacent to one another, which limits shrinking of SRAM needed for advanced IC technology nodes and limits design flexibility related to reducing resistance and/or capacitance of the MLI structure.

The present disclosure thus proposes a four times contacted poly pitch (4CPP) SRAM cell layout that forms the six SRAM transistors from one OD region and four poly lines at a frontside of a substrate. In such embodiments, word line and first voltage line are located over the six transistors and formed in metallization layers of an MLI structure formed over the frontside of the substrate, while bit line, bit line bar, and second voltage line are located under the six transistors and formed in metallization layers of an MLI structure formed over the backside of the substrate. In contrast to the 2CPP SRAM cell layout and the 4CPP-2OD SRAM layout, the proposed 4CPP-1OD SRAM layout vertically stacks some of the six transistors. For example, pull-up transistor PU-1 is formed vertically adjacent pull-down transistor PD-1, pull-up transistor PU-2 is formed vertically adjacent pull-down transistor PD-2, where the pull-up/pull-down transistor stacks are disposed between pass-gate transistor PG-1 and pass-gate transistor PG-2. The proposed 4CPP-1OD SRAM layout can reduce SRAM cell area, SRAM cell density, and/or SRAM cell footprint, along with reducing resistance and/or capacitance of the MLI structure by allowing for wider word lines, bit lines, and voltage lines, compared to the 2CPP SRAM cell layout and the 4CPP-2OD SRAM layout. Details of the embodiments of the present disclosure are described in the following pages.

Figure 2A:
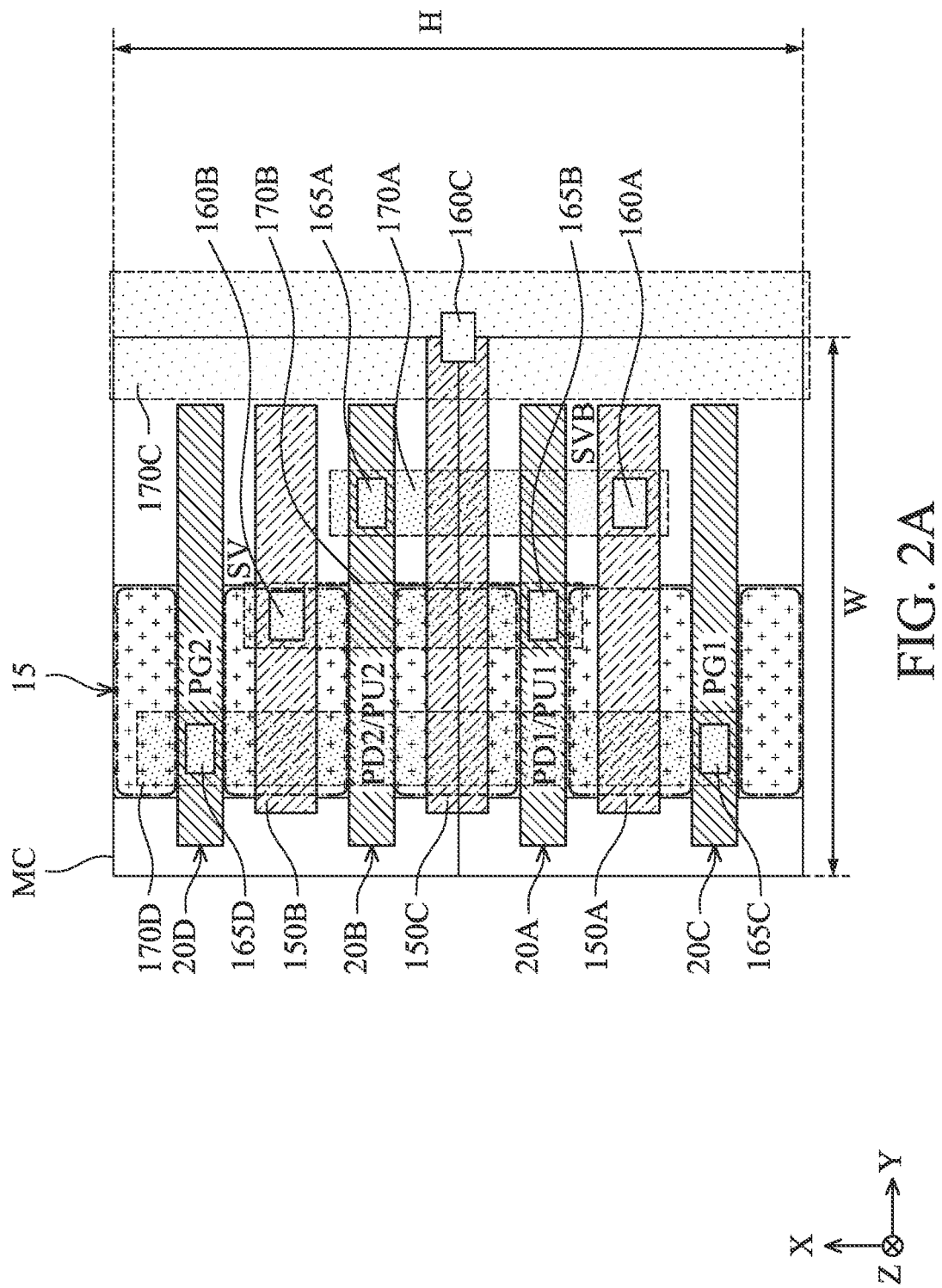
FIGS. 2A-2D are fragmentary diagrammatic views of a vertical SRAM, in portion or entirety, according to various aspects of the present disclosure.
Figure 2B:
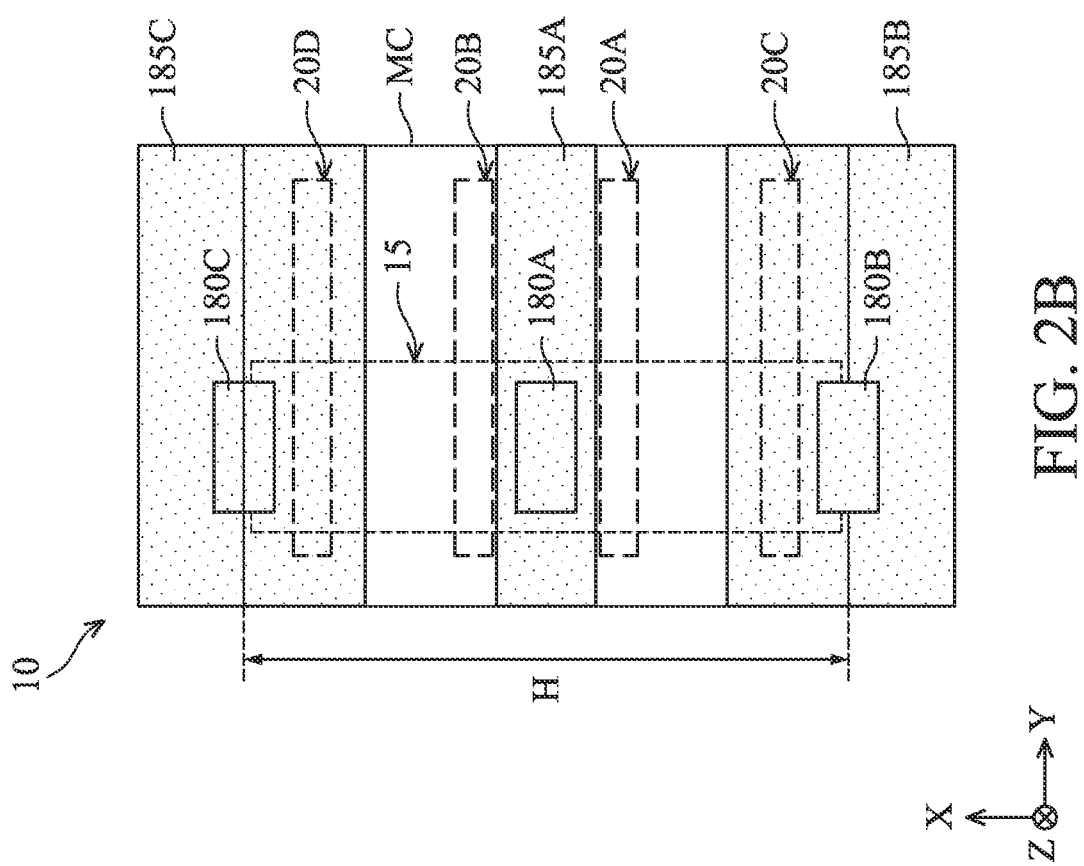
Figure 2C:
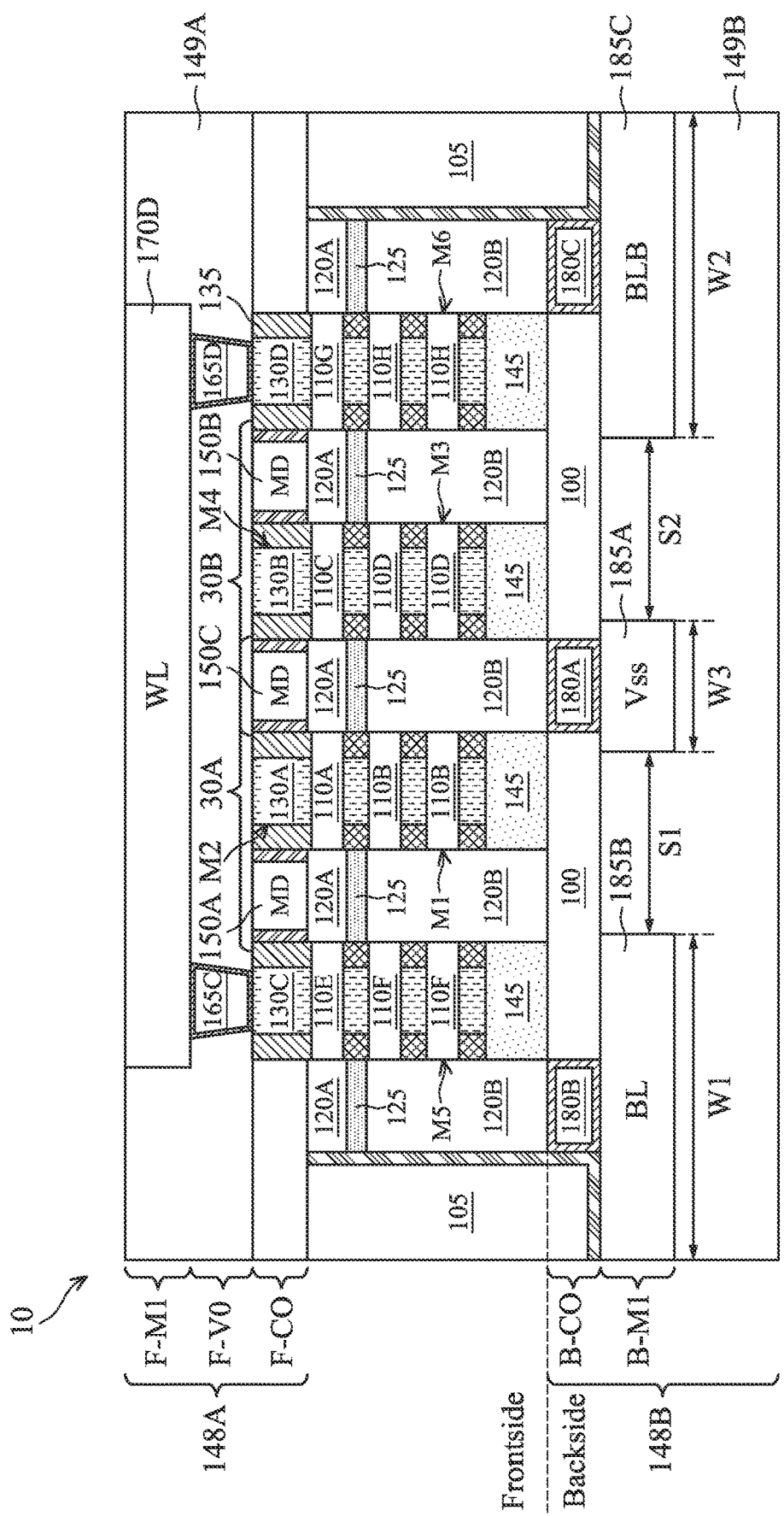
Figure 2D:
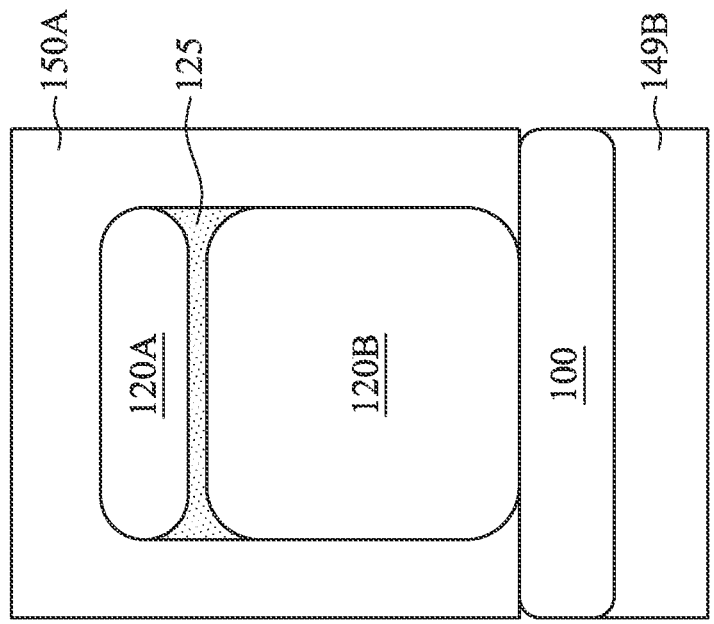
Figure 2D:
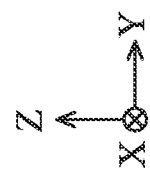

FIG. 1 is a circuit diagram of a vertical static random-access memory (SRAM) 10 with a double-sided routing structure, in portion or entirety, according to various aspects of the present disclosure. FIG. 2A is a fragmentary diagrammatic top view of a frontside of vertical SRAM 10, in portion or entirety, according to various aspects of the present disclosure; FIG. 2B is a fragmentary diagrammatic top view of a backside of vertical SRAM 10, in portion or entirety, according to various aspects of the present disclosure; FIG. 2C is a fragmentary diagrammatic cross-sectional view of vertical SRAM 10 along line A-A of FIG. 2A and FIG. 2B, in portion or entirety, according to various aspects of the present disclosure; and FIG. 2D is a fragmentary diagrammatic cross-sectional view of vertical SRAM 10 along line B-B of FIG. 2A and FIG. 2B, in portion or entirety, according to various aspects of the present disclosure. Vertical SRAM 10 may be included in a microprocessor, a memory, and/or other IC device. In some embodiments, vertical SRAM 10 may be a portion of an IC chip, a system on chip (SoC), or portion thereof, that includes various passive and active electronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like field effect transistors (FinFETs) or gate-all-around (GAA) transistors. FIG. 1 and FIGS. 2A-2D have been simplified for the sake of clarity to better understand the inventive concepts of the present disclosure. Additional features can be added in vertical SRAM 10, and some of the features described below can be replaced, modified, or eliminated in other embodiments of vertical SRAM 10.

Vertical SRAM 10 includes six transistors: a pull-down transistor PD-1 (also designated as transistor M1), a pull-up transistor PU-1 (also designated as transistor M2), a pull-down transistor PD-2 (also designated as transistor M3), a pull-up transistor PU-2 (also designated as transistor M4), a pass-gate transistor PG-1 (also designated as transistor M5), and a pass-gate transistor PG-2 (also designated as transistor M6). Vertical SRAM 10 is thus alternatively referred to as a 6T SRAM. A storage portion of vertical SRAM 10 includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter-1. In operation, pass-gate transistor PG-1 and pass-gate transistor PG-2 provide access to the storage portion of vertical SRAM 10 (i.e., Inverter-1 and Inverter-2) and can also be referred to as access transistors of vertical SRAM 10. In the depicted embodiment, vertical SRAM 10 is a single-port SRAM. In some embodiments, vertical SRAM 10 is configured as a multi-port SRAM, such as a dual-port SRAM, and/or with more or less transistors than depicted, such as an 8T SRAM.

Vertical SRAM 10 is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node $V_{SS}$, and the first common drain. A gate of pull-up transistor PU-2 interposes a source, which is electrically coupled to the first power supply voltage via voltage node $V_{DD}$, and a second common drain (CD2) (i.e., a drain of pull-up transistor PU-2 and a drain of pull-down transistor PD-2). A gate of pull-down transistor PD-2 interposes a source, which is electrically coupled to the second power supply voltage via voltage node $V_{SS}$, and the second common drain. The first common drain provides a storage node SNB that stores data in complementary form, and the second common drain provides a storage node SN that stores data in true form, or vice versa, in some embodiments. The gate of pull-up transistor PU-1 and the gate of pull-down transistor PD-1 are coupled together and to the second common drain, and the gate of pull-up transistor PU-2 and the gate of pull-down transistor PD-2 are coupled together and to the first common drain. A gate of pass-gate transistor PG-1 interposes a drain connected to a complementary bit line node BLBN, which is electrically coupled to a complementary bit line $\overline{BL}$, and a source, which is electrically coupled to the first common drain. A gate of pass-gate transistor PG-2 interposes a drain connected to a bit line node BLN, which is electrically coupled to a bit line BL, and a source, which is electrically coupled to the second common drain. Gates of pass-gate transistors PG-1, PG-2 are connected to and controlled by a word line WL, which allows selection of vertical SRAM 10 for reading and/or writing. In some embodiments, pass-gate transistors PG-1, PG-2 provide access to storage nodes SNB, SN, respectively, each of which can store a bit (e.g., a logical 0 or a logical 1), during read operations and/or write operations. For example, pass-gate transistors PG-1, PG-2 couple storage nodes SNB, SN, respectively, to bit lines $\overline{BL}$, BL in response to voltage applied to gates of pass-gate transistors PG-1, PG-2 by word line WL.

Turning to FIGS. 2A-2D, vertical SRAM 10 has a four times contacted poly pitch (4CPP) SRAM cell layout that forms its six transistors (e.g., M1, M2, M3, M4, M5, and M6) from one active (OD) region 15 and four gate (poly) lines, such as a gate line 20A, a gate line 20B, a gate line 20C, and a gate line 20D, at a frontside of a substrate 100. In the depicted embodiment, substrate 100 is an insulator substrate formed from one or more dielectric layers. For example, substrate 100 includes a first dielectric layer and a second dielectric layer (collectively referred to as a dielectric substrate), where the first dielectric layer wraps the second dielectric layer (e.g., a dielectric liner that wraps a dielectric bulk layer). In some embodiments, the first dielectric layer is disposed along a top and sidewalls of the second dielectric layer. The first dielectric layer and the second dielectric layer include different dielectric materials, each of which can include silicon, oxygen, nitrogen, carbon, other suitable dielectric constituent, or combinations thereof. In the depicted embodiment, the first dielectric layer includes silicon and nitrogen, and the second dielectric layer includes oxygen. For example, the first dielectric layer is a silicon nitride layer, and the second dielectric layer is an oxide layer. In some embodiments, second dielectric layer further includes silicon, such as a silicon oxide layer.

Active region 15 extends lengthwise along an x-direction (i.e., length is along the x-direction, width is along a y-direction, and height is along a z-direction), and gate lines 20A-20D are oriented substantially parallel to one another and extend lengthwise along the y-direction (i.e., length is along the y-direction, width is along the x-direction, and height is along the z-direction), such that gate lines 20A-20D are oriented substantially orthogonal to active region 15. Isolation features 105 isolate active region 15 from other active device regions and/or passive device regions of vertical SRAM 10 and/or other active device regions and/or passive device regions of an IC to which the vertical SRAM 10 belongs. In some embodiments, isolation features 105 surround active region 15. Isolation features 105 include silicon oxide, silicon nitride, silicon oxynitride, other suitable isolation material (for example, including silicon, oxygen, nitrogen, carbon, or other suitable isolation constituent), or combinations thereof. In some embodiments, isolation features 105 have a multi-layer structure, such as an oxide layer disposed over a silicon nitride liner. In some embodiments, isolation features 105 include a dielectric layer disposed over a doped liner (including, for example, boron silicate glass (BSG) or phosphosilicate glass (PSG)). In some embodiments, isolation features 105 include a bulk dielectric layer disposed over a dielectric liner. Isolation features 105 can be configured as shallow trench isolation (STI) structures, deep trench isolation (DTI) structures, local oxidation of silicon (LOCOS) structures, and/or other suitable isolation structures.

Active region 15 includes channel regions, source regions, and drain regions (where source regions and drain regions are collectively referred to as source/drain regions) of the six transistors of vertical SRAM 10. Active region 15 is a GAA-based active region, where channel regions of active region 15 are formed in semiconductor layers 110A-110H suspended over substrate 100 (i.e., semiconductor layers 110A-110H do not physically contact substrate 100), and source/drain regions of active region 15 are formed in epitaxial source/drain features, such as epitaxial source/drain features 120A and epitaxial source/drain features 120B. For example, active region 15 includes a first semiconductor layer stack (e.g., a semiconductor layer 110A and semiconductor layers 110B vertically stacked along the z-direction over substrate 100), a second semiconductor layer stack (e.g., a semiconductor layer 110C and semiconductor layers 110D vertically stacked along the z-direction over substrate 100), a third semiconductor layer stack (e.g., a semiconductor layer 110E and semiconductor layers 110F vertically stacked along the z-direction over substrate 100), and a fourth semiconductor layer stack (e.g., a semiconductor layer 110G and semiconductor layers 110H vertically stacked along the z-direction over substrate 100). As described further below, semiconductor layers 110A-110H provide transistors of vertical SRAM 10 with channels and are thus also referred to as channel layers.

Semiconductor layers 110A-110H include a semiconductor material, such as silicon, germanium, silicon germanium, silicon carbide, gallium arsenide, gallium phosphide, indium phosphide, indium arsenide, indium antimonide, GaAsP, AlInAs, AlGaAs, GaInAs, GaInP, GaInAsP, or combinations thereof. In the depicted embodiment, semiconductor layers 110A-110H are silicon channel layers. In some embodiments, semiconductor layers 110A-110H include n-type dopants (e.g., phosphorus, arsenic, other n-type dopant, or combinations thereof) and/or p-type dopants (e.g., boron, indium, other p-type dopant, or combinations thereof). In some embodiments, semiconductor layers 110A-110H have nanometer-sized dimensions and can be referred to as "nanostructures," alone or collectively. For example, semiconductor layers 110A-110H can have widths along the y-direction, lengths along the x-direction, and thicknesses along the z-direction. The present disclosure also contemplates embodiments where semiconductor layers 110A-110H have sub-nanometer dimensions and/or greater than nanometer dimensions. Semiconductor layers 110A-110H can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures)), or any other suitable shaped profile.

Each semiconductor layer stack (i.e., channel stack) of active region 15 extends between source/drain stacks (also referred to as source/drain regions) of active region 15. Each source/drain stack includes an epitaxial source/drain feature 120A disposed over and vertically above an epitaxial source/drain feature 120B, where a dielectric layer 125 of each source/drain stack is disposed between epitaxial source/drain feature 120A and epitaxial source/drain feature 120B. Epitaxial source/drain feature 120A and epitaxial source/drain feature 120B are thus separated and isolated from each other by dielectric layer 125. Dielectric layer 125 includes silicon oxide, silicon nitride, silicon oxynitride, other suitable isolation material (for example, including silicon, oxygen, nitrogen, carbon, or other suitable isolation constituent), or combinations thereof. In the depicted embodiment, semiconductor layer 110A, semiconductor layer 110C, semiconductor layer 110E, and semiconductor layer 110G each extend between a respective pair of epitaxial source/drain features 120A, and semiconductor layers 110B, semiconductor layers 110D, semiconductor layers 110F, and semiconductor layers 110H each extend between a respective pair of epitaxial source/drain features 120B. Each pair of epitaxial source/drain features 120B has a portion of substrate 100 that extends therebetween.

Epitaxial source/drain features 120A and epitaxial source/drain features 120B have different compositions. For example, epitaxial source/drain features 120A form portions of first type transistors and have a first composition that optimizes performance of first type transistors, and epitaxial source/drain features 120B form portions of second type transistors and have a second composition that optimizes performance of second type transistors. In the depicted embodiment, epitaxial source/drain features 120A form portions of p-type transistors and epitaxial source/drain features 120B form portions of n-type transistors. In such embodiments, for p-type transistors, epitaxial source/drain features 120A include silicon germanium or germanium, which can be doped with boron, other p-type dopant, or combinations thereof. In furtherance of such embodiments, for n-type transistors, epitaxial source/drain features 120B include silicon, which can be doped with carbon, phosphorous, arsenic, other n-type dopant, or combinations thereof. In some embodiments, epitaxial source/drain features 120A and/or epitaxial source/drain features 120B include more than one epitaxial semiconductor layer, where the epitaxial semiconductor layers include the same or different materials and/or the same or different dopant concentrations. In some embodiments, epitaxial source/drain features 120A and/or epitaxial source/drain features 120B include materials and/or dopants that achieve desired tensile stress and/or compressive stress in semiconductor layers 110A-110H.

Gate lines 20A-20D (also referred to as gate structures) each include a metal gate (e.g., a metal gate 130A, a metal gate 130B, a metal gate 130C, and a metal gate 130D, respectively) and gate spacers 135 disposed along sidewalls of the metal gate. Metal gates 130A-130D are disposed over channel regions of active region 15 (i.e., respective semiconductor layers 110A-110H) and are further disposed between respective source/drain regions of active region 15 (i.e., epitaxial source/drain features 120A, 120B). In the X-Z plane, metal gates 130A-130D cover top surfaces and bottom surfaces of respective semiconductor layers 110A-110H, and in the Y-Z plane, metal gates 130A-130D cover top surfaces, bottom surfaces, and sidewalls of respective semiconductor layers 110A-110H, such that each of semiconductor layers 110A-110H is wrapped and/or surrounded by a respective one of metal gates 130A-130D. For example, metal gate 130A surrounds semiconductor layer 110A and semiconductor layers 110B (i.e., first semiconductor layer stack of active region 15), metal gate 130B surrounds semiconductor layer 110C and semiconductor layers 110D (i.e., second semiconductor layer stack of active region 15), metal gate 130C surrounds semiconductor layer 110E and semiconductor layers 110F (i.e., third semiconductor layer stack of active region 15), and metal gate 130D surrounds semiconductor layer 110G and semiconductor layers 110H (i.e., fourth semiconductor layer stack of active region 15). Metal gate 130A engages semiconductor layer 110A and semiconductor layers 110B, such that current can flow between respective epitaxial source/drain features 120A and respective epitaxial source/drain features 120B, respectively, during operation. Metal gate 130B engages semiconductor layer 110C and semiconductor layers 110D, such that current can flow between respective epitaxial source/drain features 120A and respective epitaxial source/drain features 120B, respectively, during operation. Metal gate 130C engages semiconductor layers 110F, such that current can flow between respective epitaxial source/drain features 120B during operation. Metal gate 130D engages semiconductor layers 110H, such that current can flow between respective epitaxial source/drain features 120B during operation. In some embodiments, metal gate 130C engages semiconductor layer 110E and/or metal gate 130D engages semiconductor layer 110G, such that current can flow between respective epitaxial source/drain features 120A during operation.

Metal gates 130A-130D (also referred to as metal gate stacks and/or high-k/metal gates) are configured to achieve desired functionality according to design requirements of vertical SRAM 10. Each of metal gates 130A-130D includes a gate dielectric (e.g., a gate dielectric layer) and a gate electrode (e.g., a work function layer and a bulk conductive layer) formed over the gate dielectric. Metal gates 130A-130D may include numerous other layers, such as capping layers, interface layers, diffusion layers, barrier layers, hard mask layers, or combinations thereof. Metal gates 130A-130D may have the same or different number, configuration, and/or materials of layers that form gate dielectrics and/or gate electrodes. Gate dielectrics of metal gates 130A-130D include a high-k dielectric layer, which includes a high-k dielectric material, which refers to a dielectric material having a dielectric constant that is greater than that of silicon dioxide. For example, the high-k dielectric layer includes $HfO_2$, HfSiO, $HfSiO_4$, HfSiON, HfLaO, HfTaO, HfTiO, HfZrO, HfAlO, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. In some embodiments, gate dielectrics include an interfacial layer disposed between the high-k dielectric layer and semiconductor layers 110A-110H. The interfacial layer includes a dielectric material, such as $SiO_2$, HfSiO, SiON, other silicon-comprising dielectric material, other suitable dielectric material, or combinations thereof. Gate electrodes of metal gates 130A-130D include a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes include a work function layer and a bulk conductive layer. The work function layer can be a metal layer tuned to have a desired work function (e.g., an n-type work function or a p-type work function), and the bulk layer can be a bulk metal layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof.

Gate spacers 135 are disposed adjacent to (i.e., along sidewalls of) metal gates 130A-130D. Gate spacers 135 include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonitride). In some embodiments, gate spacers 135 include a multi-layer structure, such as a first dielectric layer that includes silicon nitride and a second dielectric layer that includes silicon oxide. In some embodiments, gate spacers 135 include more than one set of spacers, such as seal spacers, offset spacers, sacrificial spacers, dummy spacers, and/or main spacers.

Inner spacers 140 are disposed under gate lines 20A-20D (in particular, under gate spacers 135 in the depicted embodiment) along sidewalls of metal gates 130A-130D. Inner spacers 140 are disposed between, and in the depicted embodiment, separate metal gates 130A-130D and epitaxial source/drain features 120A, epitaxial source/drain features 120B, and/or dielectric layers 125. Inner spacers 140 are further disposed between adjacent semiconductor layers 110A-110H and between bottommost semiconductor layers (e.g., bottommost semiconductor layer 110B, bottommost semiconductor layer 110D, bottommost semiconductor layer 110F, and bottommost semiconductor layer 110H) and dielectric layers 145. Bottommost inner spacers 140 and bottommost portions of metal gates 130A-130D physically contact dielectric layers 145, instead of substrate 100. Inner spacers 140 include a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, inner spacers 140 include a low-k dielectric material, such as those described herein. In some embodiments, dopants (for example, p-type dopants, n-type dopants, or combinations thereof) are introduced into the dielectric material. In such embodiments, inner spacers 140 include a doped dielectric material.

Vertical SRAM 10 stacks transistors, vertically, to facilitate scaling needed for advanced IC technology nodes and improve memory performance. For example, vertical SRAM 10 has a first transistor stack 30A that includes pull-up transistor PU-1 (M2) vertically above and adjacent to pull-down transistor PD-1 (M1) and a second transistor stack 30B that includes pull-up transistor PU-2 (M4) vertically above and adjacent to pull-down transistor PD-2 (M3), where first transistor stack 30A and second transistor stack 30B are disposed between pass-gate transistor PG-1 (M5) and pass-gate transistor PG-2 (M6). Pull-up transistor PU-1 has a gate (e.g., metal gate 130A) disposed over a channel (e.g., semiconductor layer 110A) and between source/drains (e.g., respective pair of epitaxial source/drain features 120A). Pull-down transistor PD-1 has a gate (e.g., metal gate 130A) disposed over a channel (e.g., semiconductor layers 110B) and between source/drains (e.g., respective pair of epitaxial source/drain features 120B). Pull-up transistor PU-2 has a gate (e.g., metal gate 130B) disposed over a channel (e.g., semiconductor layer 110C) and between source/drains (e.g., respective pair of epitaxial source/drain features 120A). Pull-down transistor PD-2 has a gate (e.g., metal gate 130B) disposed over a channel (e.g., semiconductor layers 110D 120D) between source/drains (e.g., respective pair of epitaxial source/drain features 120B). Pass-gate transistor PG-1 has a gate (e.g., metal gate 130C) disposed over a channel (e.g., semiconductor layers 110F) and between source/drains (e.g., respective pair of epitaxial source/drain features 120B). Pass-gate transistor PG-2 has a gate (e.g., metal gate 130D) disposed over a channel (e.g., semiconductor layers 110H) and between source/drains (e.g., respective pair of epitaxial source/drain features 120B). In such embodiments, pull-down transistor PD-1, pull-down transistor PD-2, pass-gate transistor PG-1, and pass-gate transistor PG-2 are multi-channel GAA transistors (including, for example, two channels, such as semiconductor layers 110B, semiconductor layers 110D, semiconductor layers 110F, and semiconductor layers 110H, respectively), and pull-up transistor PU-1 and pull-up transistor PU-2 are single channel GAA transistors (including, for example, one channel, such as semiconductor layer 110A and semiconductor layer 110C, respectively). In some embodiments, pull-down transistor PD-1, pull-down transistor PD-2, pass-gate transistor PG-1, and/or pass-gate transistor PG-2 include more or less channels. In some embodiments, pull-up transistor PU-1 and/or pull-up transistor PU-2 include multiple channels. In the depicted embodiment, pull-up transistors PU-1, PU-2 are configured as p-type GAA transistors, and pull-down transistors PD-1, PD-2 and pass-gate transistors PG-1, PG-2 are configured as n-type GAA transistors. In such embodiments, semiconductor layers 110A-110H are doped with n-type dopants and/or p-type dopants to provide channels for p-type GAA transistors (referred to as p-channels) or channels for n-type GAA transistors (referred to as n-channels). For example, semiconductor layer 110A and semiconductor layer 110C, which respectively provide p-channels for pull-up transistors PU-1, PU-2, are n-doped, and epitaxial source/drain features 120A for pull-up transistors PU-1, PU-2 are p-doped (e.g., silicon germanium epitaxial source/drains doped with boron, indium, and/or other p-type dopant), and semiconductor layers 110B, semiconductor layers 110D, semiconductor layers 110F, and semiconductor layers 110H, which respectively provide n-channels for pull-down transistors PD-1, PD-2 and pass-gate transistors PG-1, PG-2, are p-doped, and epitaxial source/drain features 120B for pull-down transistors PD-1, PD-2 and pass-gate transistors PG-1, PG-2 are n-doped (e.g., silicon or silicon carbon epitaxial source/drains doped with phosphorous, arsenic, and/or other n-type dopant).

In some embodiments, vertical SRAM 10 includes dummy transistors, which are configured physically and/or structurally similar to active transistors of vertical SRAM 10, but are electrically non-functional as active transistors (for example, dummy transistors are electrically non-functional in vertical SRAM 10). For example, vertical SRAM 10 includes a first dummy transistor that includes a gate (e.g., metal gate 130C) disposed over a channel (e.g., semiconductor layer 110E) between source/drains (e.g., respective pair of epitaxial source/drain features 120A) and a second dummy transistor that includes a gate (e.g., metal gate 130D) disposed over a channel (e.g., semiconductor layer 110G) between source/drains (e.g., respective pair of epitaxial source/drain features 120A). The first dummy transistor is vertically above and adjacent to pass-gate transistor PG-1 (which is also collectively referred to as a transistor stack), and the second dummy transistor is vertically above and adjacent to pass-gate transistor PG-2 (which is also collectively referred to as a transistor stack). In such embodiments, the first dummy transistor and the second dummy transistor have channels with the same type doping as their respective epitaxial source/drain features. For example, semiconductor layer 110E and semiconductor layer 110G, which respectively provide channels for the dummy transistors, are p-doped, and epitaxial source/drain features 120A are p-doped (e.g., silicon germanium epitaxial source/drains doped with boron, indium, and/or other p-type dopant).

With the stacked configuration, first transistor stack 30A and second transistor stack 30B share metal gates and/or epitaxial source/drain features. For example, pull-up transistor PU-1 and pull-up transistor PU-2 share one of epitaxial source/drain features 120A (i.e., a source of pull-up transistor PU-1 and a source of pull-up transistor PU-2 are formed from the same epitaxial source/drain feature 120A, which as described further below, is electrically connected to the first supply voltage (e.g., $V_{DD}$)), and pull-down transistor PD-1 and pull-down transistor PD-2 share one of epitaxial source/drain features 120B (i.e., a source of pull-down transistor PD-1 and a source of pull-down transistor PD-2 are formed from the same epitaxial source/drain feature 120B, which as described further below, is electrically connected to the second supply voltage (e.g., $V_{SS}$)). In furtherance of the example, pass-gate transistor PG-1 and pull-down transistor PD-1 share one of epitaxial source/drain features 130B (i.e., a source of pass-gate transistor PG-1 and a drain of pull-down transistor PD-1 are formed from the same epitaxial source/drain feature 120B), and pass-gate transistor PG-2 and pull-down transistor PD-2 share one of epitaxial source/drain features 120B (i.e., a source of pass-gate transistor PG-2 and a drain of pull-down transistor PD-2 are formed from the same epitaxial source/drain feature 120B). In yet furtherance of the example, pull-down transistor PD-1 and pull-up transistor PU-1 share a gate (i.e., a gate of pull-down transistor PD-1 and a gate of pull-up transistor PU-1 are formed from respective portions of metal gate 130A), and pull-down transistor PD-2 and pull-up transistor PU-2 share a gate (i.e., a gate of pull-down transistor PD-2 and a gate of pull-up transistor PU-2 are formed from respective portions of metal gate 130B).

Vertical SRAM 10 has a double-sided routing structure (also referred to as a double-sided multilayer interconnect (MLI) feature) that electrically couples various devices and/or components of vertical SRAM, such that the various devices and/or components can operate as specified by design requirements. In the depicted embodiment, the double-sided routing structure includes a frontside routing structure 148A and a backside routing structure 148B, which are disposed over a frontside and a backside, respectively, of substrate 100. Frontside routing structure 148A has a frontside contact layer (F-CO level or metal zero (M0) level), a frontside via zero layer (F-V0 level), and a frontside metal one layer (F-M1 level). Backside routing structure 148B has a backside contact layer (B-CO level or metal zero (M0) level) and a backside metal one layer (B-M1 level). Conductive features of F-CO layer, F-V0 layer, F-M1 layer, B-CO layer, and B-M1 layer are routed along a first routing direction or a second routing direction that is different than the first routing direction. For example, the first routing direction is the x-direction (and substantially parallel with the lengthwise direction of active region 15) and the second routing direction is the y-direction (and substantially parallel with the lengthwise direction of gate structures 20A-20D). In the depicted embodiment, F-M1 layer is routed along the first routing direction, and B-M1 layer is routed along the second routing direction. Each level of frontside routing structure 148A and a backside routing structure 148B includes conductive features (e.g., metal lines, metal vias, and/or metal contacts) disposed in one or more dielectric layers (e.g., an interlayer dielectric (ILD) layer and a contact etch stop layer (CESL)), which are collectively depicted as a dielectric layer 149A and a dielectric layer 149B. In some embodiments, conductive features at a same level of frontside routing structure 148A and/or backside routing structure 148B, such as F-CO level, are formed simultaneously. In some embodiments, conductive features at a same level of frontside routing structure 148A and/or backside routing structure 148B have top surfaces that are substantially planar with one another and/or bottom surfaces that are substantially planar with one another. In some embodiments, frontside routing structure 148A and/or backside routing structure 148B include more levels than depicted, such as a frontside via one layer (F-V1 level), a frontside metal two layer (F-M2 level), a frontside via two layer (F-V2 level), a frontside metal three layer (F-M3 level), a backside via one layer (B-V1 level), a backside metal two layer (B-M2 level), a backside via two layer (B-V2 level), a backside metal three layer (B-M3 level), etc. The present disclosure contemplates various configurations of levels for frontside routing structure 148A and/or backside routing structure 148B.

F-CO layer includes conductive features, such as a source/drain contact 150A, a source/drain contact 150B, and a source/drain contact 150C (collectively referred to as device-level contacts), that connect frontside device features of vertical SRAM 10 to conductive features of F-V0 layer, such as a source/drain via 160A, a source/drain via 160B, and a source/drain via 160C. In the X-Z plane (FIG. 2C), source/drain contacts 150A-150C are disposed on respective epitaxial source/drain features 120A and between respective gate spacers 135. Source/drain contact 150A is located between, physically contacts, and connects epitaxial source/drain feature 120A of pull-up transistor PU-1, shared epitaxial source/drain feature 120B of pull-down transistor PD-1 and pass-gate transistor PG-1, and source/drain via 160A. Source/drain contact 150B is located between, physically contacts, and connects epitaxial source/drain feature 120A of pull-up transistor PU-2, shared epitaxial source/drain feature 120B of pull-down transistor PD-2 and pass-gate transistor PG-2, and source/drain via 160B. Accordingly, source/drain contact 150A electrically connects the drain of pull-up transistor PU-1, the drain of pull-down transistor PD-1, and the source of pass-gate transistor PG-1, and source/drain contact 150B electrically connects the drain of pull-up transistor PU-2, the drain of pull-down transistor PD-2, and the source of pass-gate transistor PG-2. In the Y-Z plane (FIG. 2D), source/drain contact 150A and source/drain contact 150B each wrap a respective epitaxial source/drain stack of first transistor stack 30A and/or second transistor stack 30B, such that source/drain contact 150A and source/drain contact 150B each physically contact both a respective epitaxial source/drain features 120A and a respective epitaxial source/drain features 120B. For example, source/drain contact 150A covers and/or physically contacts a top and sidewalls of epitaxial source/drain feature 120A of pull-up transistor PU-1, sidewalls of shared epitaxial source/drain feature 120B of pull-down transistor PD-1 and pass-gate transistor PG-1, and sidewalls of a respective dielectric layer 125 therebetween, and source/drain contact 150B covers and/or physically contacts a top and sidewalls of epitaxial source/drain feature 120A of pull-up transistor PU-2, sidewalls of shared epitaxial source/drain feature 120B of pull-down transistor PD-2 and pass-gate transistor PG-2, and sidewalls of a respective dielectric layer 125 therebetween. Source/drain contact 150C is located between, physically contacts, and connects shared epitaxial source/drain feature 120A of pull-up transistor PU-1 and pull-up transistor PU-2 and source/drain via 160C.

In the X-Z plane (FIG. 2C), source/drain contacts 150A-150C are each disposed on a top of a respective epitaxial source/drain feature 120A. In the Y-Z plane, source/drain contact 150C is configured different than source/drain contact 150A and source/drain contact 150B. For example, since shared epitaxial source/drain feature 120A of pull-up transistor PU-1 and pull-up transistor PU-2 is not electrically connected to shared epitaxial source/drain feature 120B of pull-down transistor PD-1 and pull-down transistor PD-2 (i.e., sources of pull-up transistors PU-1, PU-2 are not electrically connected to sources of pull-down transistors PD-1, PD-2), source/drain contact 150C does not contact a respective epitaxial source/drain feature 120B. For example, source/drain contact 150C covers and physically contacts a top and sidewalls of shared epitaxial source/drain feature 120A of pull-up transistor PU-1 and pull-up transistor PU-2 but does not cover and/or physically contact shared epitaxial source/drain feature 120B of pull-down transistor PD-1 and pull-down transistor PD-2. In some embodiments, source/drain contact 150C covers and/or physically contacts tops, but not sidewalls, of shared epitaxial source/drain feature 120A of pull-up transistor PU-1 and pull-up transistor PU-2. In some embodiments, source/drain contact 150C also covers and/or physically contacts sidewalls of a respective dielectric layer 125 between shared epitaxial source/drain feature 120A of pull-up transistor PU-1 and pull-up transistor PU-2 and shared epitaxial source/drain feature 120B of pull-down transistor PD-1 and pull-down transistor PD-2. Source/drain contacts 150A-150C cover and/or physically contact a portion or an entirety of tops and/or sidewalls of respective epitaxial source/drain features 120A and/or respective epitaxial source/drain features 120B.

The conductive features of F-V0 layer, such as source/drain vias 160A-160C, a gate via 165A, a gate via 165B, a gate via 165C, and a gate via 165D, connect F-CO layer to conductive features of F-M1 layer, such as a metal line 170A, a metal line 170B, a first voltage line (e.g., a $V_{DD}$ line 170C) electrically connected to a first voltage (e.g., a positive supply voltage, such as $V_{DD}$), and a word line 170D. Source/drain via 160A is located between, physically contacts, and connects source/drain contact 150A to metal line 170A, source/drain via 160B is located between, physically contacts, and connects source/drain contact 150B to metal line 170B, and source/drain via 160C is located between, physically contacts, and connects source/drain contact 150C to $V_{DD}$ line 170C. Gate via 165A is located between, physically contacts, and connects metal gate 130B of gate structure 20B to metal line 170A; gate via 165B is located between, physically contacts, and connects metal gate 130A of gate structure 20A to metal line 170B; gate via 165C is located between, physically contacts, and connects metal gate 130C of gate structure 20C to word line 170D, and gate via 165D is located between, physically contacts, and connects metal gate 130D of gate structure 20D to word line 170D.

With the stacked transistor configuration of vertical SRAM 10 and its corresponding F-CO layer, F-V0 layer, and F-M1 layer configuration, source/drain contact 150A electrically connects the drain of pull-down transistor PD-1 and the drain of pull-up transistor PU-1, such that a first common drain of pull-down transistor PD-1 and pull-up transistor PU-1 can provide storage node SNB. The first common drain is electrically connected to shared gate of pull-up transistor PU-2 and pull-down transistor PD-2 (e.g., metal gate 130B) by source/drain contact 150A, source/drain via 160A, gate via 165A, and metal line 170A. Further, source/drain contact 150B electrically connects the drain of pull-down transistor PD-2 and the drain of pull-up transistor PU-2, such that a second common drain of pull-down transistor PD-2 and pull-up transistor PU-2 form storage node SN. The second common drain is electrically connected to shared gate of pull-up transistor PU-1 and pull-down transistor PD-1 (e.g., metal gate 130A) by source/drain contact 150B, source/drain via 160B, gate via 165B, and metal line 170B. The first common drain and the second common drain are further electrically connected to the source of pass-gate transistor PG-1 and the source of pass-gate transistor PG-2, respectively, by shared epitaxial source/drain feature 120B of pull-down transistor PD-1 and pass-gate transistor PG-1 and shared epitaxial source/drain feature 120B of pull-down transistor PD-2 and pass-gate transistor PG-2. Further, the source of pull-up transistor PU-1 and the source of pull-up transistor PU-2 (e.g., shared epitaxial source/drain feature 120A of pull-up transistor PU-1 and pull-up transistor PU-2) are electrically connected to $V_{DD}$ line 170C by source/drain contact 150C, the gate of pass-gate transistor PG-1 (e.g., metal gate 130C) is electrically connected to word line 170D by gate via 165C, and the gate of pass-gate transistor PG-2 (e.g., metal gate 130D) is electrically connected to word line 170D by gate via 165D.

B-CO layer includes conductive features, such as a source/drain contact 180A, a source/drain contact 180B, and a source/drain contact 180C (collectively referred to as device-level contacts), that connect backside device features of vertical SRAM 10 to conductive features of B-M1 layer, such as a second voltage line (e.g., a $V_{SS}$ line 185A) electrically connected to a second voltage (e.g., a ground voltage, such as $V_{SS}$), a bit line 185B, and a bit line bar 185C. Source/drain contact 180A is located between, physically contacts, and connects shared epitaxial source/drain feature 120B of pull-down transistor PD-1 and pull-down transistor PD-2 and $V_{SS}$ line 185A. Source/drain contact 180B is located between, physically contacts, and connects epitaxial source/drain feature 120B of pass-gate transistor PG-1 and bit line 185B. Source/drain contact 180C is located between, physically contacts, and connects epitaxial source/drain feature 120B of pass-gate transistor PG-2 and bit line bar 185C. In the X-Z plane (FIG. 2C), source/drain contacts 180A-180C are disposed on respective epitaxial source/drain features 120B and within a dielectric layer, which in the depicted embodiment, includes substrate 100 and isolation features 105. In the Y-Z plane, since shared epitaxial source/drain feature 120B of pull-down transistor PD-1 and pull-down transistor PD-2 is not electrically connected to shared epitaxial source/drain feature 120A of pull-up transistor PU-1 and pull-up transistor PU-2 (i.e., sources of pull-up transistors PU-1, PU-2 are not electrically connected to sources of pull-down transistors PD-1, PD-2), source/drain contact 180A does not contact a respective epitaxial source/drain feature 120A. Further, source/drain contact 180B and source/drain contact 180C do not contact a respective epitaxial source/drain feature 120A. Instead, source/drain contact 180A covers and physically contacts a top and sidewalls of shared epitaxial source/drain feature 120B of pull-down transistor PD-1 and pull-down transistor PD-2 but does not cover and/or physically contact shared epitaxial source/drain feature 120A of pull-up transistor PU-1 and pull-up transistor PU-2; source/drain contact 180B covers and physically contacts a top and sidewalls of epitaxial source/drain feature 120B of pass-gate transistor PG-1 but does not cover and/or physically contact overlying epitaxial source/drain feature 120A, which is a portion of a dummy transistor as described above; and source/drain contact 180C covers and physically contacts a top and sidewalls of epitaxial source/drain feature 120B of pass-gate transistor PG-2 but does not cover and/or physically contact overlying epitaxial source/drain feature 120A, which is also a portion of a dummy transistor. In some embodiments, source/drain contact 180A covers and/or physically contacts tops, but not sidewalls, of shared epitaxial source/drain feature 120B of pull-down transistor PD-1 and pull-down transistor PD-2; source/drain contact 180B covers and/or physically contacts tops, but not sidewalls, of epitaxial source/drain feature 120B of pass-gate transistor PG-1; and/or source/drain contact 180C covers and/or physically contacts tops, but not sidewalls, of epitaxial source/drain feature 120B of pass-gate transistor PG-2. In some embodiments, source/drain contact 180A, source/drain contact 180B, and/or source/drain contact 180C also covers and/or physically contacts sidewalls of a respective dielectric layer 125. In some embodiments, source/drain contacts 180A-180C cover and/or physically contact a portion or an entirety of tops and/or sidewalls of a respective epitaxial source/drain feature 120B.

With the stacked transistor configuration of vertical SRAM 10 and its corresponding B-CO layer and B-M1 layer configuration, the source of pull-down transistor PD-1 and the source of pull-down transistor PD-2 (e.g., shared epitaxial source/drain feature 120B of pull-down transistor PD-1 and pull-down transistor PD-2) are electrically connected to $V_{SS}$ line 185C by source/drain contact 180A, the drain of pass-gate transistor PG-1 (e.g., respective epitaxial source/drain feature 120B) is electrically connected to bit line 185B by source/drain contact 180B, and the drain of pass-gate transistor PG-2 (e.g., respective epitaxial source/drain feature 120B) is electrically connected to bit line bar 185C by source/drain contact 180C.

Capacitance and/or resistance from bit lines, word lines, and voltage lines have become significant factors in SRAM performance as SRAM cell sizes shrink to achieve SRAM cells with faster operating speeds (e.g., by reducing distances traveled by electrical signals) at scaled IC technology nodes, such as 20 nm node to 10 nm node to 3 nm node and below. For example, shrinking SRAM cell size should lead to decreasing resistance-capacitance (RC) delay, which generally indicates delay in electrical signal speed through an IC resulting from a product of resistance (R) (i.e., a material's opposition to flow of electrical current) and capacitance (C) (i.e., a material's ability to store electrical charge). However, capacitance and/or resistance have been observed to increase as dimensions and/or spacings of bit lines, word lines, and/or voltage lines decrease with shrinking SRAM cell sizes (and increasing SRAM cell density), thereby undesirably increasing RC delay and decreasing SRAM speed, such as write/read speed. Tradeoffs between capacitance and resistance must thus be considered to optimize SRAM performance. For example, since capacitance increases as a number of interconnections (e.g., contacts, vias, and/or metal lines) between a metal line (e.g., bit line, word line, or voltage line) and a device layer (e.g., gate or source/drain feature) increases and routing density typically increases as metallization level of the MLI feature decreases (i.e., a routing density of M1 layer is greater than a routing density of M2 layer or a routing density of M3 layer), a metal line placed in a lowest metallization level of an MLI feature (i.e., M1 layer) may decrease line capacitance but increase line resistance (for example, by needing only one via to connect the metal line and a a gate or epitaxial source/drain feature of a transistor, but needing a narrower and/or thinner metal line to meet higher routing specifications), while a metal line placed in a higher metallization level of the MLI feature (e.g., M2 layer or M3 layer) may increase line capacitance but decrease line resistance (for example, by needing more than one via and at least one landing pad to connect the metal line and the gate or epitaxial source/drain feature of the transistor, but allowing for a wider and/or a thicker metal line to meet routing density specifications that are lower than routing density specifications of M1 layer).

Vertical SRAM 10 addresses these challenges by stacking transistors and providing a double-sided routing structure, which facilitates placement of bit lines (here, bit line 185B and bit line bar 185B), word lines (here, word line 170D), and voltage lines (here, $V_{DD}$ line 170C and $V_{SS}$ line 185A) in M1 layer, which is a lowest metallization level of an MLI feature, to minimize line capacitance and line resistance. The double-sided routing structure of vertical SRAM 10 also facilitates increasing spacing between metal lines in a metal layer of an MLI feature, which further facilitates increasing widths of the metal lines in the metal layer, thereby reducing line resistance. For example, spacing between metal lines in B-M1 layer, such as a spacing S1 and a spacing S2, can be about 30 nm to about 50 nm, which allows for wider metal lines in B-M1 layer, such as wider bit lines (e.g., bit line 185B and/or bit line bar 185C) and/or wider voltage lines (e.g., $V_{SS}$ line 185A). In some embodiments, a width W1 of bit line 185B and a width W2 of bit line 185C is about 50 nm to about 70 nm, which provides for significant line resistance reduction. In some embodiments, a width W3 of $V_{SS}$ line 185A is about 20 nm to about 40 nm, which provides for significant line resistance reduction. Width W3 is less than width W1 and width W2. Width W1 is the same, less than, or greater than width W2. Spacing S1 is the same, less than, or greater than spacing S2. Different embodiments may have different advantages, and no particular advantage is required of any embodiment.

In some embodiments, vertical SRAM 10 is a memory cell (also referred to as bit cell) for storing data. The memory cell has a cell boundary MC, which has a first dimension, such as a cell width W, along a first direction (e.g., y-pitch along a y-direction) and a second dimension, such as a cell height H, along a second direction (e.g., x-pitch along a x-direction). Where vertical SRAM 10 is repeated in a memory array, cell width W may represent and be referred to as a memory cell pitch in the memory array along an x-direction and cell height H may represent and be referred to as a memory cell pitch in the memory array along a y-direction.

Figure 3:
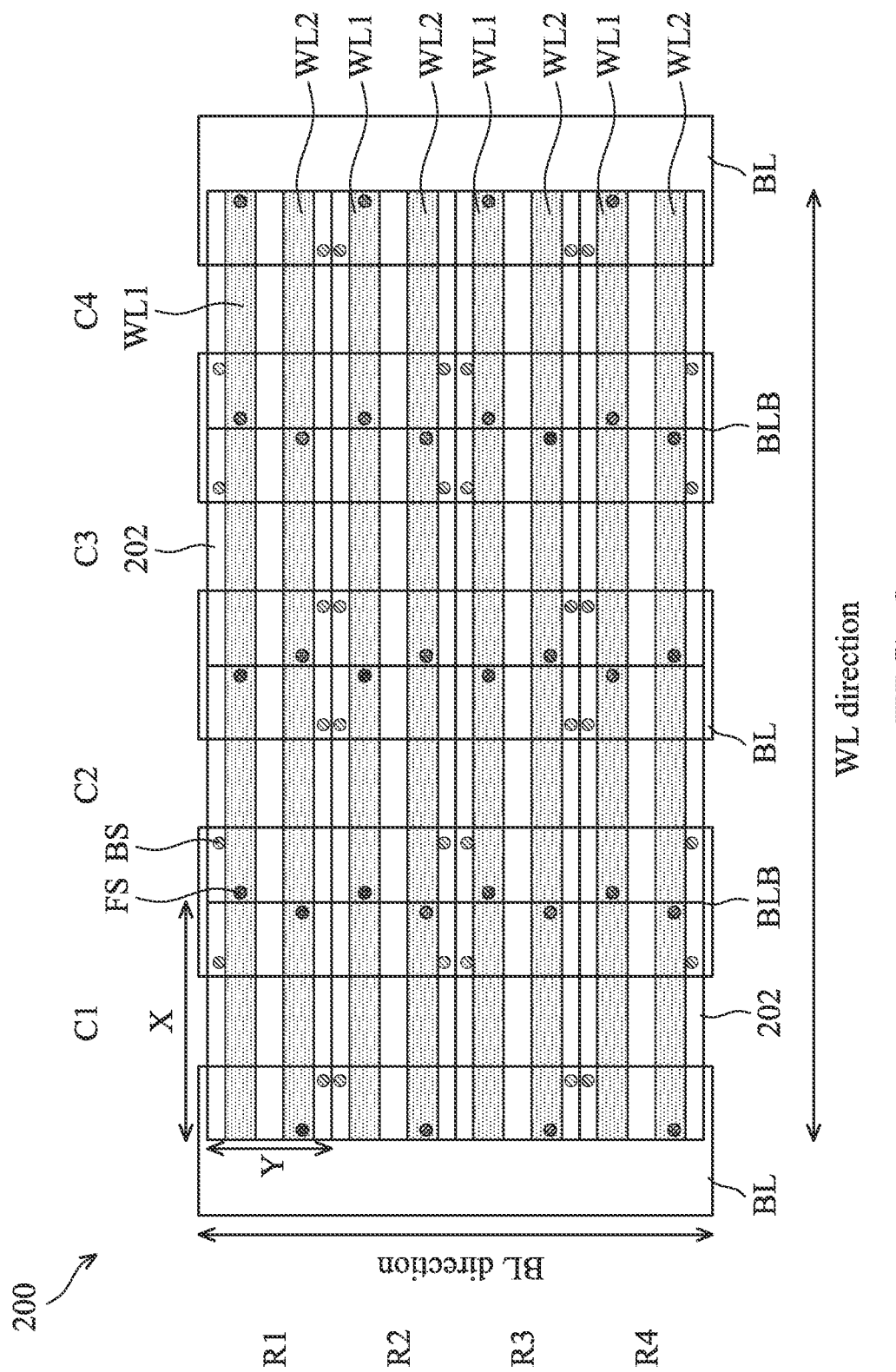
FIG. 3 illustrates a memory cell array, in portion or entirety, having a bit line configuration according to various aspects of the present disclosure.

The double-sided routing structure of vertical SRAM 10 also facilitates routing configurations of bit lines and word lines for memory cell arrays that can reduce resistance and/or capacitance, along with enabling significant shrinking of memory cell arrays. For example, FIG. 3 illustrates a memory cell array 200, in portion or entirety, having a bit line configuration for improving performance according to various aspects of the present disclosure. In FIG. 3, memory cell array 200 is a 4×4 array having memory cells 202 arranged in four columns (columns C1-C4) along a y-direction (also referred to as a bit line direction) and four rows (rows R1-R4) along an x-direction (also referred to as a word line direction). Bit lines BL and bit line bars BLB extend along the y-direction. By configuring memory cells 202 as vertical SRAMs with double-sided routing structures, such as vertical SRAM 10, bit lines BL and bit line bars BLB can be shared by memory cells 202 in adjacent columns, instead of each column of memory cells 202 having a respective bit line BL and a respective bit line bar BLB. For example, in memory cell array 200, column C1 and column C2 share a bit line bar BLB, column C2 and column C3 share a bit line BL, and column C3 and column C4 share a bit line bar BLB. Such configuration increases a number of memory cells 202 (i.e., bits) controlled by a bit line BL and/or bit line bar BLB. In the depicted embodiment, bit lines BL and/or bit line bars BLB are connected to eight memory cells 202 (i.e., eight bits) by backside interconnections BS. In contrast, conventional frontside routing structures are limited to connection of bit lines BL and/or bit line bars BLB to four memory cells (i.e., four bits) by frontside interconnections. Further, placing bit lines BL and/or bit line bars BLB at a backside of memory cells 202 facilitates wider bit lines BL and/or wider bit line bars BLB, which reduces capacitance and/or resistance, compared to memory arrays having conventional frontside routing structures. Even further, moving bit lines BL and/or bit line bars BLB to a backside of memory cells 202 allows for a double word line structure at a frontside of memory cells 202, which can significantly reduce resistance. For example, each of rows R1-R4 has a respective word line WL1 and a respective word line WL2 connected thereto by frontside interconnections FS. In some embodiments, the depicted configuration will reduce capacitance by as much as 37% compared to memory arrays having conventional frontside routing structures. FIG. 3 has been simplified for the sake of clarity to better understand the inventive concepts of the present disclosure. Additional features can be added in memory cell array 200, and some of the features described below can be replaced, modified, or eliminated in other embodiments of memory cell array 200.

Figure 4A:
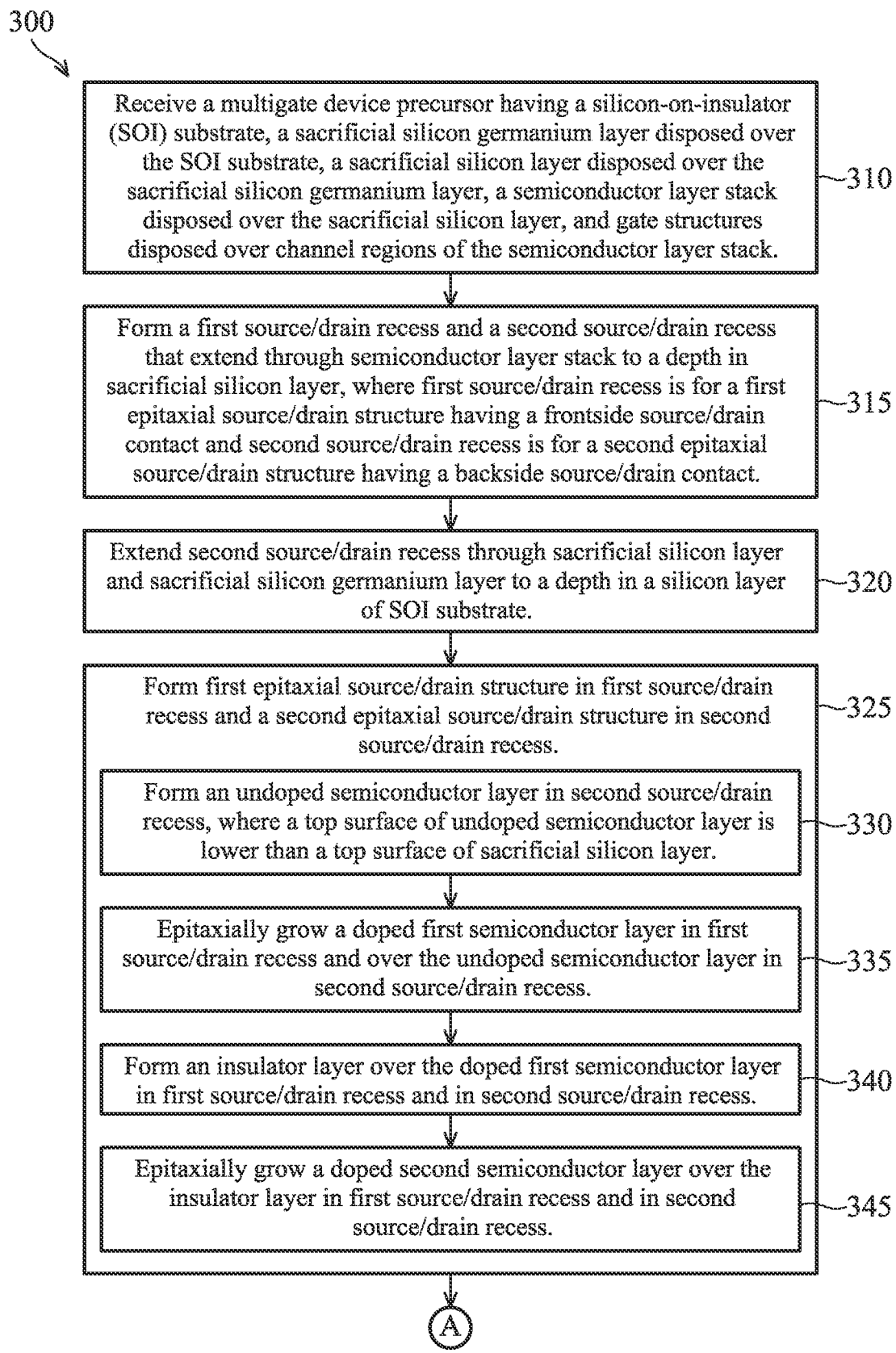
FIG. 4A and FIG. 4B are a flow chart of a method for fabricating a multigate device, in portion or entirety, of a vertical SRAM, according to various aspects of the present disclosure.
Figure 4B:
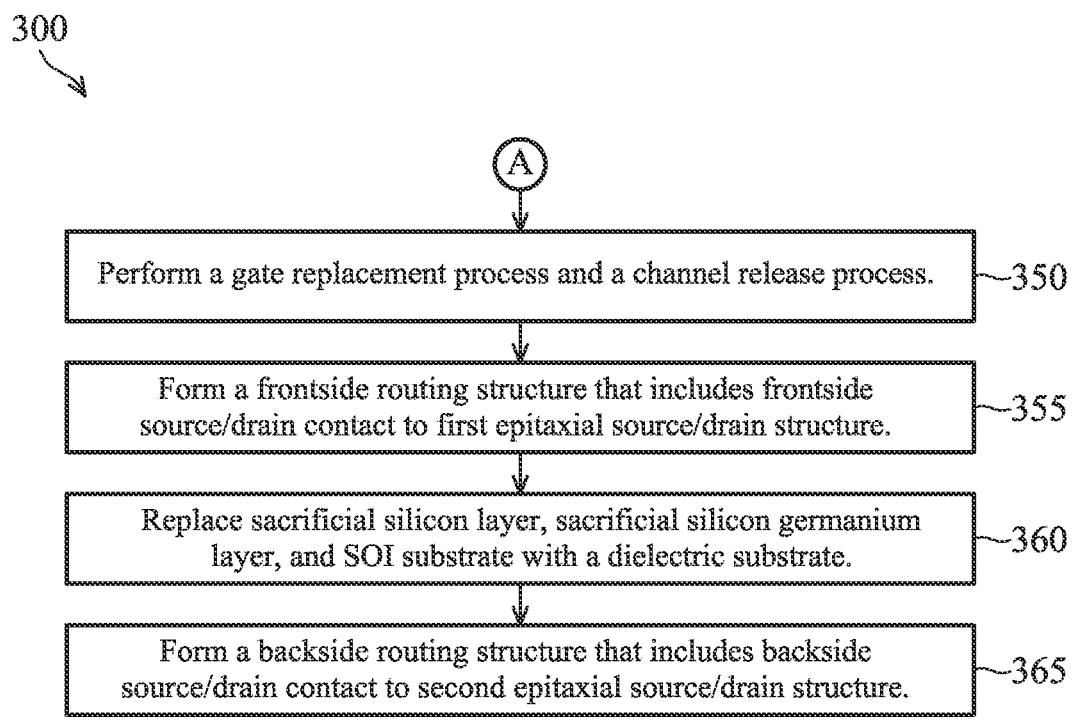
Figure 5A:
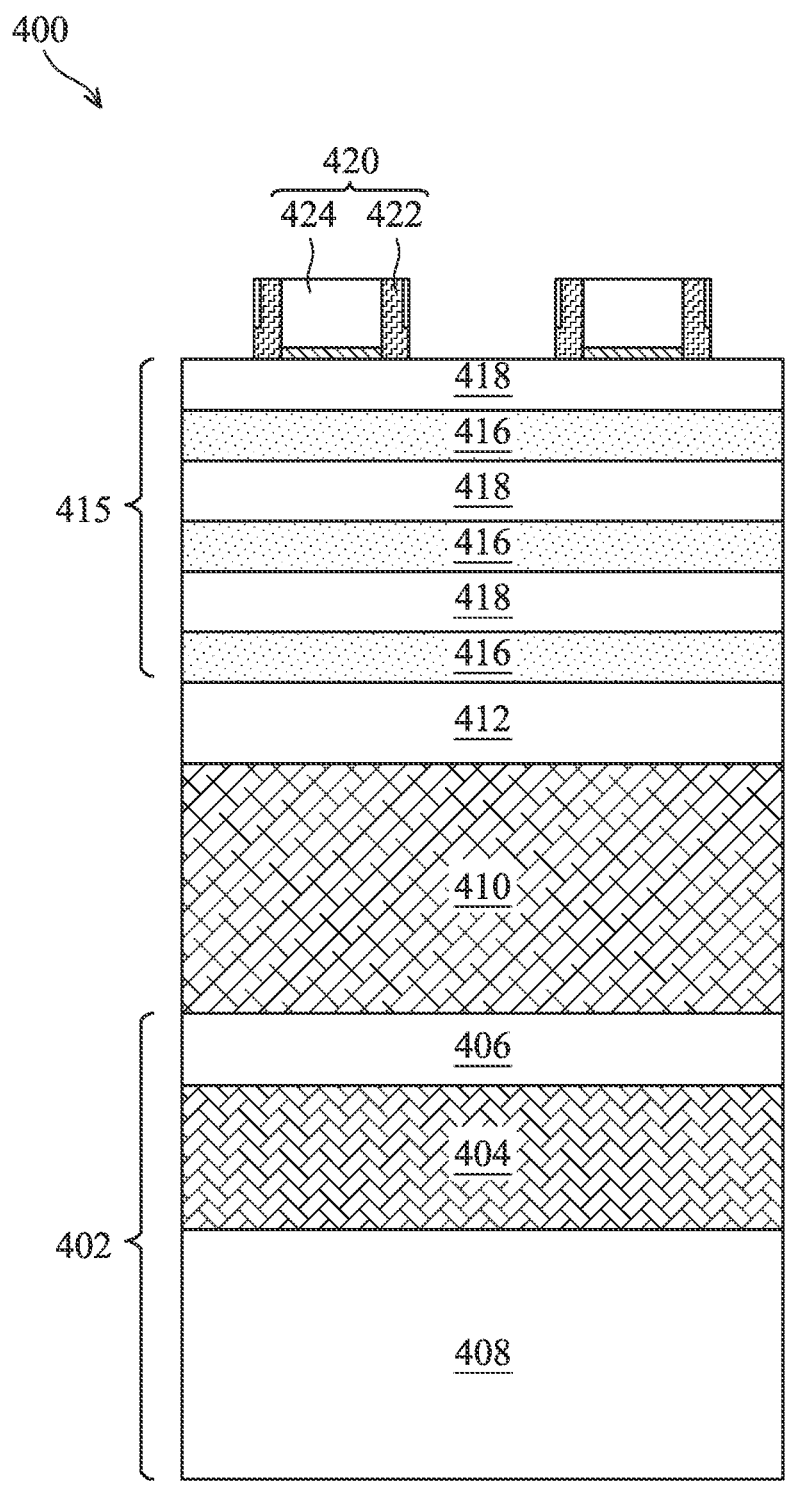
FIGS. 5A-5O are fragmentary perspective views of a multigate device, in portion or entirety, of a vertical SRAM at various fabrication stages, such as those associated with the method in FIG. 4A and FIG. 4B, according to various aspects of the present disclosure.

FIG. 4A and FIG. 4B are a flow chart of a method 300 for fabricating a multigate device, in portion or entirety, of a vertical SRAM according to various aspects of the present disclosure. FIGS. 5A-5O are fragmentary perspective views of a multigate device 400, in portion or entirety, of a vertical SRAM at various fabrication stages associated with method 300 in FIG. 4A and FIG. 4B according to various aspects of the present disclosure. For ease of description and understanding, the following discussion of FIG. 4A, FIG. 4B, and FIGS. 5A-5O are discussed concurrently. In some embodiments, method 300 of FIG. 4A and FIG. 4B and/or processing associated with FIGS. 5A-5O can be implemented to fabricate transistors and/or various features, in portion or entirety, of vertical SRAM 10 of FIGS. 2A-2D. FIG. 4A, FIG. 4B, and FIGS. 5A-5O have been simplified for the sake of clarity to better understand the inventive concepts of the present disclosure. Additional steps can be provided before, during, and after method 300, and some of the steps described can be moved, replaced, or eliminated for additional embodiments of method 300. Additional features can be added in multigate device 400, and some of the features described below can be replaced, modified, or eliminated in other embodiments of multigate device 400.

Turning to FIG. 4A and FIG. 5A, method 300 begins at block 310 with receiving a multigate device precursor for a multigate device 400. Multigate device precursor includes a silicon-on-insulator (SOI) substrate 402 (having an insulator layer 404 disposed between a silicon layer 406 and a silicon layer 408), a sacrificial silicon germanium layer 410, a sacrificial silicon layer 412, a semiconductor layer stack 415 having semiconductor layers 416 and semiconductor layers 418, and gate structures 420 having gate spacers 422 disposed along sidewalls of dummy gates 424. In SOI substrate 402 (also referred to as a wafer), a thickness of insulator layer 404 and a thickness of silicon layer 406 are each less than a thickness of silicon layer 408. In the depicted embodiment, thickness of silicon layer 406 is less than thickness of insulator layer 404. In some embodiments, thickness of silicon layer 406 is greater than thickness of insulator layer 404. In some embodiments, thickness of insulator layer 404 is about 10 nm to about 30 nm, thickness of silicon layer 406 is about 5 nm to about 10 nm, and thickness of silicon layer 408 is about 20 nm to about 40 nm. In some embodiments, insulator layer 404 is an oxide layer, such as a silicon oxide layer. In the depicted embodiment, a thickness of sacrificial silicon germanium layer 410 is greater than a thickness of sacrificial silicon layer 412. In some embodiments, thickness of sacrificial silicon germanium layer 410 corresponds with a thickness of a subsequently formed backside contact of multigate device 400. In some embodiments, thickness sacrificial silicon germanium layer 410 is about 50 nm to about 80 nm, and thickness of sacrificial silicon layer 412 is about 20 nm to about 30 nm.

In some embodiments, processing includes depositing sacrificial silicon germanium layer 410 over SOI substrate 402, depositing sacrificial silicon layer 412 over sacrificial silicon germanium layer 410, depositing semiconductor layers 416 and semiconductor layers 418 over sacrificial silicon layer 412, and patterning semiconductor layers 416, semiconductor layers 418, and sacrificial silicon layer 412 to form semiconductor layer stack 415. Semiconductor layers 416 and semiconductor layers 418 are stacked vertically (e.g., along the z-direction) in an interleaving or alternating configuration from a top surface of sacrificial silicon germanium layer 410. In some embodiments, depositing includes epitaxially growing sacrificial silicon germanium layer 410 over SOI substrate 402, epitaxially growing sacrificial silicon layer 412 over sacrificial silicon germanium layer 410, and epitaxially growing semiconductor layers 416 and semiconductor layers 418 in the depicted interleaving and alternating configuration over sacrificial silicon layer 412. For example, sacrificial silicon germanium layer 410 is epitaxially grown on SOI substrate 402, sacrificial silicon layer 412 is epitaxially grown on sacrificial silicon germanium layer 410, a first one of semiconductor layers 416 is epitaxially grown on sacrificial silicon layer 412, a first one of semiconductor layers 418 is epitaxially grown on the first one of semiconductor layers 416, a second one of semiconductor layers 416 is epitaxially grown on the first one of semiconductor layers 418, and so on until semiconductor layer stack 415 has a desired number of semiconductor layers 416 and semiconductor layers 418. In such embodiments, sacrificial silicon germanium layer 410, sacrificial silicon layer 412, semiconductor layers 416, and semiconductor layers 418 can be referred to as epitaxial layers. In some embodiments, epitaxial growth of sacrificial silicon germanium layer 410, sacrificial silicon layer 412, semiconductor layers 416, and/or semiconductor layers 418 is achieved by a molecular beam epitaxy (MBE) process, a chemical vapor deposition (CVD) process, a metalorganic (MOCVD) process, other suitable epitaxial growth process, or combinations thereof. A composition of semiconductor layers 416 is different than a composition of semiconductor layers 418 to achieve etching selectivity and/or different oxidation rates during subsequent processing. For example, semiconductor layers 416 and semiconductor layers 418 include different materials, constituent atomic percentages, constituent weight percentages, thicknesses, and/or characteristics to achieve desired etching selectivity during an etching process, such as an etching process implemented to form suspended channel layers in channel regions of a multigate device. In FIG. 5A, where semiconductor layers 416 include silicon germanium and semiconductor layers 418 include silicon, a silicon etch rate of semiconductor layers 418 is less than a silicon germanium etch rate of semiconductor layers 416. Semiconductor layers 416 and semiconductor layers 418 can include any combination of semiconductor materials that provides desired etching selectivity, desired oxidation rate differences, and/or desired performance characteristics (e.g., materials that maximize current flow), including any of the semiconductor materials disclosed herein.

Gate structures 420, each of which includes a respective dummy gate 424 and respective gate spacers 422, are formed over semiconductor layer stack 415. Dummy gates 424 are disposed over channel regions of semiconductor layer stack 415, such that dummy gates 424 are disposed between source/drain regions of semiconductor layer stack 415. In the X-Z plane, dummy gates 424 are disposed on a top of semiconductor layer stack 415. In the Y-Z plane, dummy gates 424 are disposed over the top and sidewalls of semiconductor layer stack 415, such that dummy gates 424 wrap semiconductor layer stack 415 (i.e., a fin structure). Each dummy gate 424 can include a dummy gate dielectric, a dummy gate electrode, and a hard mask. The dummy gate dielectric includes a dielectric material, such as silicon oxide, a high-k dielectric material, other suitable dielectric material, or combinations thereof. The dummy gate electrode includes a suitable dummy gate material, such as polysilicon, and the hard mask includes any suitable hard mask material. Dummy gates 424 are formed by deposition processes, lithography processes, etching processes, other suitable processes, or combinations thereof.

Gate spacers 422 are formed adjacent to (i.e., along sidewalls of) dummy gates 424. Gate spacers 422 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, a dielectric layer including silicon and nitrogen, such as a silicon nitride layer, can be deposited over multigate device precursor and etched (e.g., anisotropically) to form gate spacers 422. In some embodiments, gate spacers 422 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gates 424. In some embodiments, gate spacers 422 include main dielectric spacers disposed over L-shaped dielectric liners. Implantation, diffusion, and/or annealing processes may be performed to form lightly doped source and drain (LDD) features and/or heavily doped source and drain (HDD) features in source/drain regions of semiconductor layer stack 415 before and/or after forming gate spacers 422, depending on design requirements.

Figure 5B:
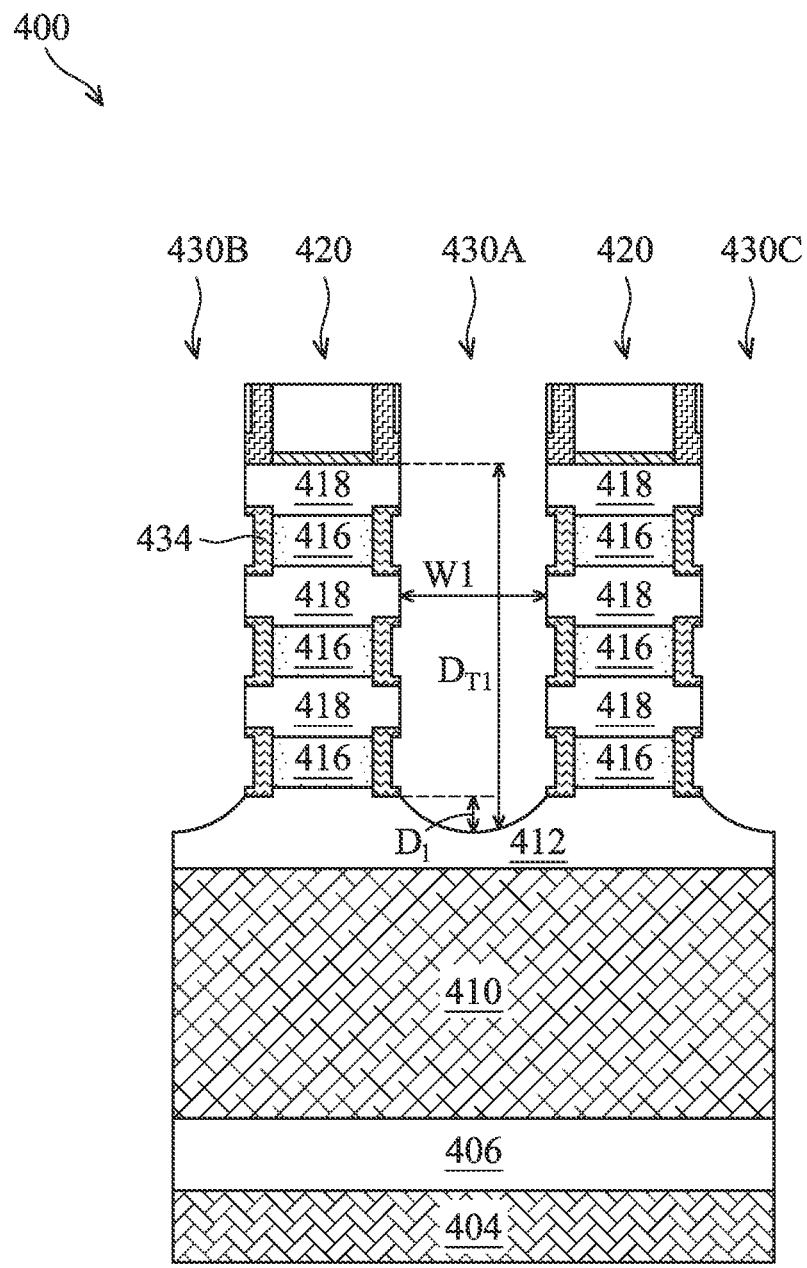

Turning to FIG. 4A and FIG. 5B, method 300 proceeds to block 315 with forming source/drain recesses (trenches), such as a source/drain recess 430A, a source/drain recess 430B, and a source/drain recess 430C, in semiconductor layer stack 415. Source/drain recesses 430A-430C extend through semiconductor layer stack 415 to a depth in sacrificial silicon layer 412 of semiconductor layer stack 415. For example, exposed portions of semiconductor layer stack 415 (i.e., source/drain regions of semiconductor layer stack 415 that are not covered by gate structures 420) are removed to form source/drain recesses 430A-430C. In FIG. 5B, an etching process completely removes semiconductor layers 416 and semiconductor layers 418 in source/drain regions of semiconductor layer stack 415 and some, but not all, of sacrificial silicon layer 412 in source/drain regions of semiconductor layer stack 415. Source/drain trenches 430A-430C thus have sidewalls formed by remaining portions (e.g., channel regions) of semiconductor layer stack 415 under gate structures 420 and bottoms formed by sacrificial silicon layer 412. Source/drain recesses 430A-430C have a width W, a total depth $D_{T1}$ between a top surface of semiconductor layer stack 415 and a bottom of source/drain recesses 430A-430C, and a depth D1 into sacrificial silicon layer 412 between topmost surface of sacrificial silicon layer 412 and bottom of source/drain recesses 430A-430C. In some embodiments, width W is about 50 nm to about 60 nm, total depth $D_{T1}$ is about 50 nm to about 70 nm, and/or depth D1 is about 50 nm to about 70 nm. In some embodiments, the etching process removes all of sacrificial silicon layer 412 in source/drain regions of semiconductor layer stack 415, such that source/drain recesses 430A-430C extend to or into sacrificial silicon germanium layer 410. The etching process can include a dry etching process, a wet etching process, other suitable etching process, or combinations thereof. In some embodiments, the etching process is a multi-step etch process. For example, the etching process may alternate etchants to separately and alternately remove semiconductor layers 416 and semiconductor layers 418. In some embodiments, parameters of the etching process are configured to selectively etch semiconductor layer stack 415 with minimal (to no) etching of gate structures 420.

In some embodiments, such as depicted, before or after forming source/drain recesses 430A-430C, a portion of SOI substrate 402 is removed from a backside of multigate device 400. In some embodiments, such processing includes flipping over multigate device 400, completely removing silicon layer 408, and partially removing insulator layer 404, thereby reducing the thickness of insulator layer 404. In some embodiments, a thickness of insulator layer 404 is the same before and after removing silicon layer 408. In some embodiments, an etching process removes silicon layer 408 and/or insulator layer 404. In some embodiments, a chemical mechanical polishing (CMP) process and/or polishing and/or planarization process removes silicon layer 408 and/or insulator layer 404. In some embodiments, a carrier wafer may be bonded to a frontside of multigate device 400 before flipping and then subsequently removed after reducing a thickness of SOI substrate 402. In some embodiments, silicon layer 408 and/or insulator layer 404 are removed from the backside of multigate device 400 without flipping. In some embodiments, a combination of etching and polishing is implemented to remove silicon layer 408 and/or insulator layer 404. In some embodiments, the portion of SOI substrate 408 is removed during subsequent processing, such as that associated with FIG. 5G.

After forming source/drain recesses 430A-430C, inner spacers 434 are formed under gate structures 420 between semiconductor layers 418 and along sidewalls of semiconductor layers 418. Inner spacers 434 separate semiconductor layers 418 from one another and bottommost semiconductor layers 418 from sacrificial silicon layer 412. Inner spacers 434 include a dielectric material that includes silicon, oxygen, carbon, nitrogen, other suitable material, or combinations thereof (e.g., silicon oxide, silicon nitride, silicon oxynitride, silicon carbide, or silicon oxycarbonitride). In some embodiments, inner spacers 434 include a low-k dielectric material, such as those described herein. In some embodiments, dopants (e.g., p-type dopants, n-type dopants, or combinations thereof) are introduced into the dielectric material, such that inner spacers 434 include a doped dielectric material. Inner spacers 434 are formed by any suitable process. In some embodiments, a first etching process is performed that selectively etches semiconductor layers 416 exposed by source/drain recesses 430A-430C with minimal (to no) etching of semiconductor layers 418, sacrificial silicon layer 412, and gate structures 420, such that gaps are formed between semiconductor layers 418 and between sacrificial silicon layer 412 and semiconductor layers 418. The gaps are disposed under gate spacers 422, such that semiconductor layers 418 are suspended under gate spacers 422 and separated from one another by the gaps. In some embodiments, the gaps extend at least partially under dummy gates 424. The first etching process is configured to laterally etch (e.g., along the x-direction and/or the y-direction) semiconductor layers 416. In the depicted embodiment, the first etching process reduces a length of semiconductor layers 416 along the x-direction. The first etching process is a dry etching process, a wet etching process, other suitable etching process, or combinations thereof. A deposition process then forms a spacer layer over gate structures 420 and over features forming source/drain recesses 430A-430C, such as CVD, PVD, ALD, RPCVD, PECVD, HDPCVD, FCVD, HARP, LPCVD, ALCVD, APCVD, SACVD, MOCVD, plating, other suitable methods, or combinations thereof. The spacer layer partially (and, in some embodiments, completely) fills source/drain recesses 430A-430C. The deposition process is configured to ensure that the spacer layer at least partially fills the gaps. A second etching process is then performed that selectively etches the spacer layer to form inner spacers 434, which fill the gaps as depicted in FIG. 5B, with minimal (to no) etching of semiconductor layers 418, sacrificial silicon layer 412, and gate structures 420. In some embodiments, the spacer layer (and thus inner spacers 434) includes a material that is different than a material of semiconductor layers 418 and sacrificial silicon layer 412, and/or materials of gate structures 420 to achieve desired etching selectivity during the second etching process.

Figure 5C:
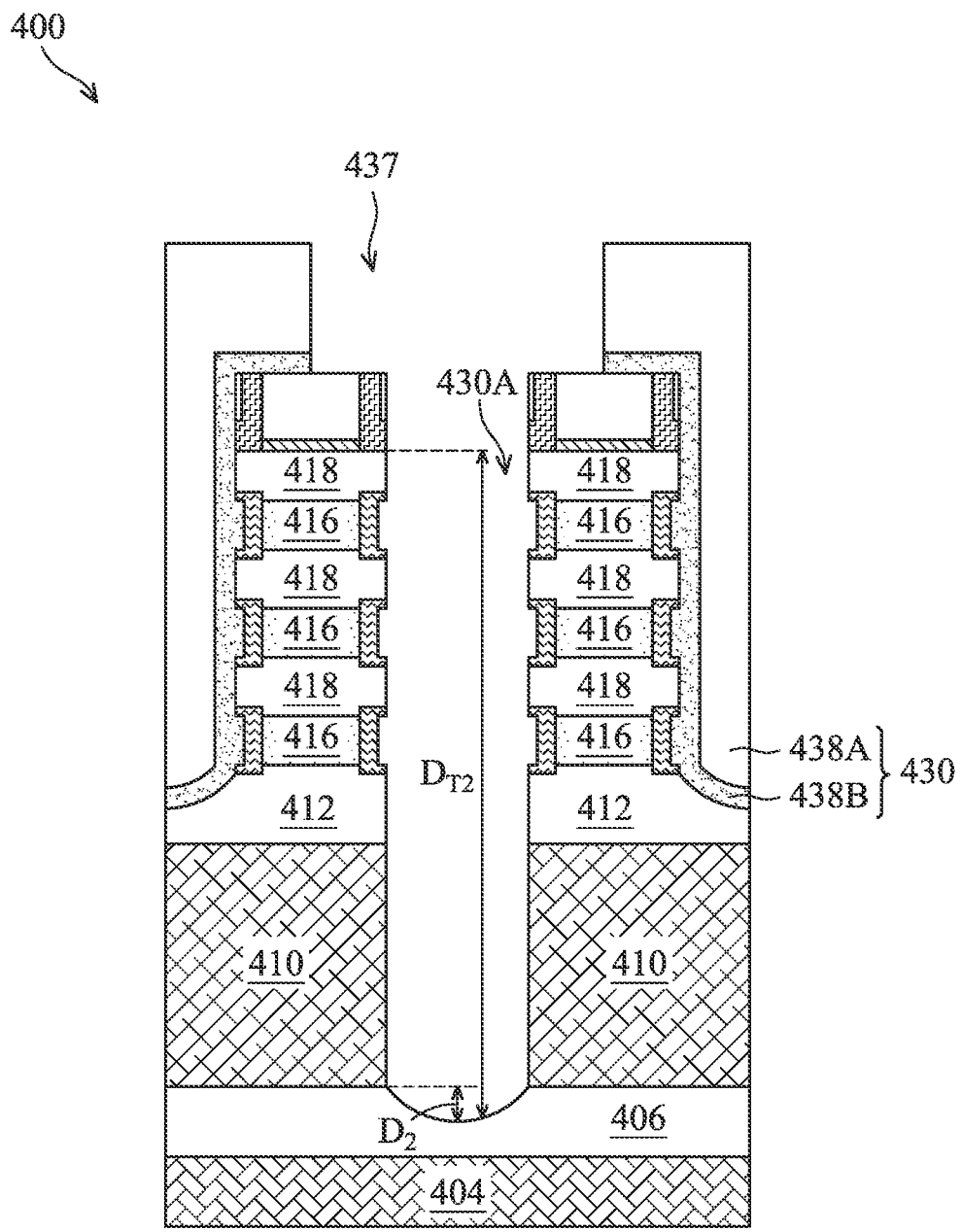

Turning to FIG. 4A and FIG. 5C, method 300 proceeds to block 320 with extending source/drain recesses for epitaxial source/drain structures having backside source/drain contacts. In the depicted embodiment, an epitaxial source/drain structure formed in source/drain recess 430A will have a backside source/drain contact (and, in some embodiments, will also have a frontside source/drain contact), while epitaxial source/drain structures formed in source/drain recess 430B and source/drain recess 430C will have frontside source/drain contacts, but not backside source/drain contacts. Accordingly, a lithography process is performed to form a patterned mask layer 436 having an opening 437 therein that exposes source/drain recess 430A, while covering source/drain recess 430B and source/drain recess 430C. In some embodiments, patterned mask layer 436 is a patterned resist layer. In some embodiments, patterned mask layer 436 is a patterned hard mask layer. In some embodiments, patterned mask layer 436 includes multiple layers, such as a patterned resist layer disposed over a patterned hard mask layer. In some embodiments, such as depicted, patterned mask layer 436 includes a first mask layer 438A and a second mask layer 438B. In FIG. 5C, opening 437 exposes source/drain recess 430A and partially exposes gate structures 420 between which source/drain recess 430A is disposed, and patterned mask layer 436 fills source/drain recess 430B and source/drain recess 430C and partially covers gate structures 420. In the depicted embodiment, tops of gate structures 420 and a respective sidewall of each gate structure 420 are exposed by patterned mask layer 436. In some embodiments, opening 437 exposes an entirety of tops of gate structures 420. In some embodiments, patterned mask layer 436 covers an entirety of tops of gate structures 420.

An etching process is then performed that extends source/drain recess 430A through sacrificial silicon layer 412, sacrificial silicon germanium layer 410, and a depth into silicon layer 406. The etching process uses patterned mask layer 436 as an etch mask. In FIG. 5C, the etching process completely removes sacrificial silicon layer 412 and sacrificial silicon germanium layer 410 and some, but not all, of silicon layer 406. Source/drain recess 430A thus has sidewalls that are further formed by sacrificial silicon layer 412 and sacrificial silicon germanium layer 410 and a bottom formed by silicon layer 406. Source/drain recess 430A has width W, a total depth $D_{T2}$ between a top surface of semiconductor layer stack 415 and a bottom of source/drain recess 430A (which is greater than total depth $D_{T1}$ of source/drain recess 430B and source/drain recess 430C), and a depth D2 into silicon layer 406 between topmost surface of silicon layer 406 and bottom of source/drain recess 430A. In some embodiments, total depth $D_{T2}$ is about 120 nm to about 200 nm and/or depth D2 is less than about 10 nm. The etching process can include a dry etching process, a wet etching process, other suitable etching process, or combinations thereof. In some embodiments, the etching process implements an etchant having low etch selectivity between silicon and silicon germanium, such that the etching process implements a single etchant to remove sacrificial silicon layer 412, sacrificial silicon germanium layer 410, and silicon layer 406. In some embodiments, the etching process is a multi-step etch process and implements etchants having high etch selectivity between silicon and silicon germanium. For example, the etching process may alternate etchants to separately remove sacrificial silicon layer 412, sacrificial silicon germanium layer 410, and then silicon layer 406. In some embodiments, parameters of the etching process are configured to selectively etch silicon and silicon germanium with minimal (to no) etching of gate structures 420.

Figure 5D:
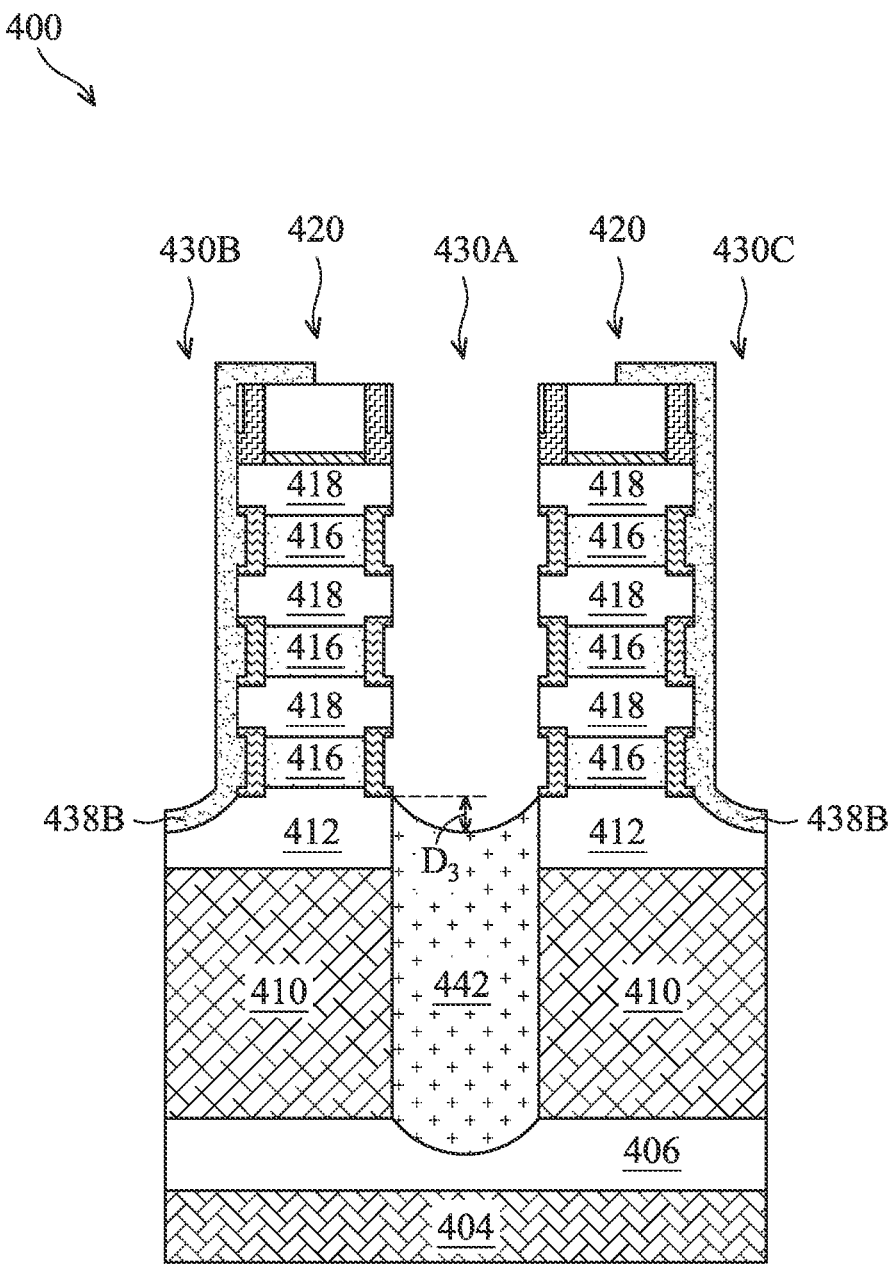
Figure 5E:
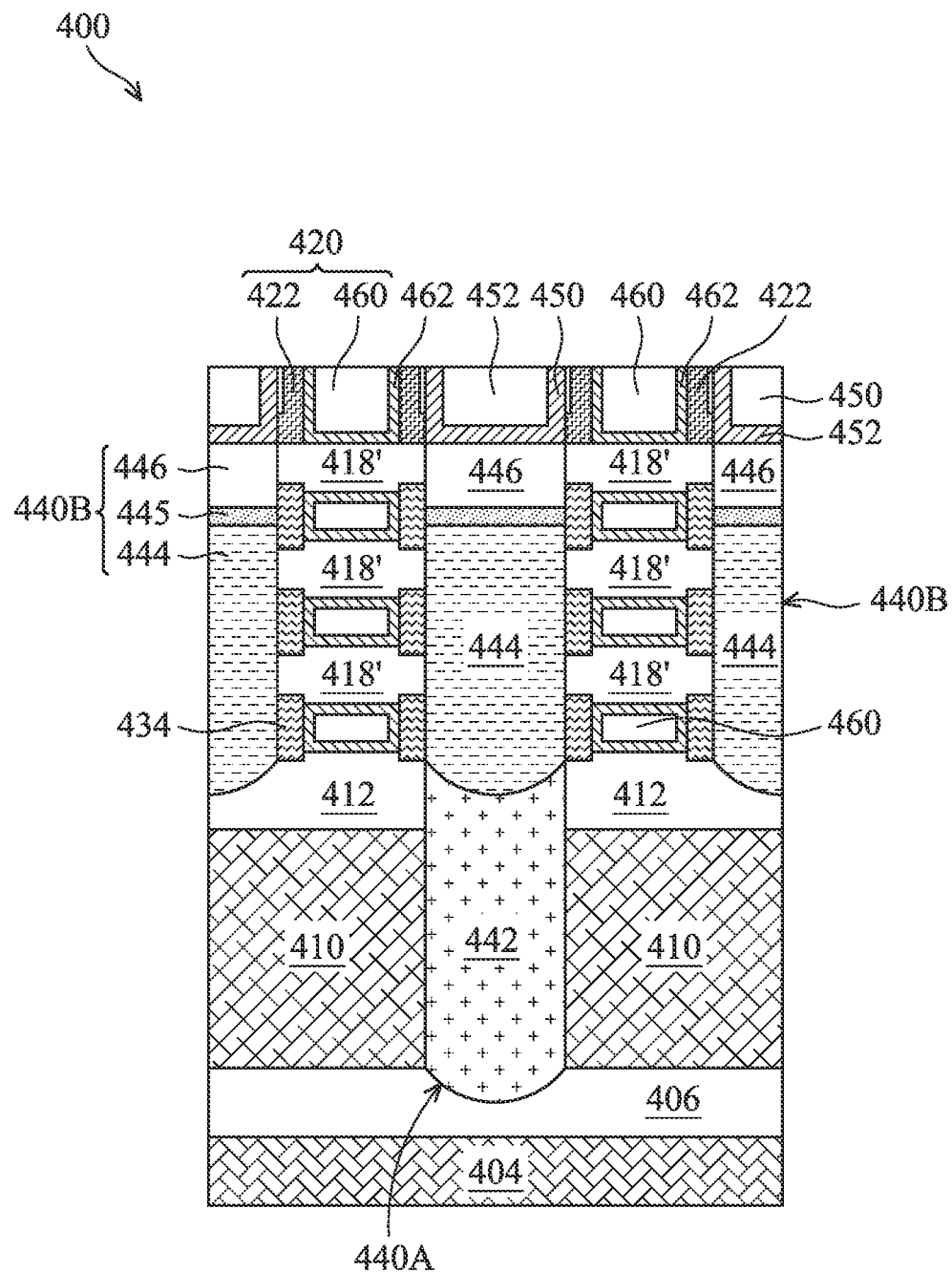

Turning to FIG. 4A, FIG. 5D, and FIG. 5E, method 300 proceeds at block 325 with forming epitaxial source/drain structures in source/drain recesses, such as an epitaxial source/drain structure 440A in source/drain recess 430A and epitaxial source/drain structures 440B in source/drain recesses 430B, 430C. For example, method 300 includes epitaxially growing an undoped semiconductor layer, such as an undoped silicon layer 442, in source/drain recess 430A at block 330 (FIG. 5D); epitaxially growing a doped first semiconductor layer, such as a doped silicon layer 444, over the undoped semiconductor layer in source/drain recesses 430A-430C at block 335 (FIG. 5E); forming an insulator layer, such as a dielectric layer 445, over the doped first semiconductor layer in source/drain recesses 430A-430C at block 340 (FIG. 5E); and epitaxially growing a doped second semiconductor layer, such as a doped silicon germanium layer 446, over the insulator layer in source/drain recesses 430A-430C (FIG. 5E). Accordingly, epitaxial source/drain structure 440A has an epitaxial source/drain stack that includes undoped silicon layer 442, doped silicon layer 444, dielectric layer 445, and doped silicon germanium layer 446, while epitaxial source/drain structures 440B have doped silicon layer 444, dielectric layer 445, and doped silicon germanium layer 446. The epitaxial source/drain stacks can be implemented in a vertical SRAM, such as vertical SRAM 10. For example, in some embodiments, doped silicon layers 444 correspond with epitaxial source/drain features 120B, doped silicon germanium layers 446 correspond with epitaxial source/drain features 120A, and dielectric layer 445 corresponds with dielectric layer 125. In some embodiments, method 300 can further include epitaxially growing a third doped semiconductor layer, such as a doped silicon capping layer, over the doped second doped semiconductor layer.

Undoped silicon layer 442 can grow from silicon layer 406, sacrificial silicon germanium layer 410, sacrificial silicon layer 412, and/or semiconductor layers 418; doped silicon layers 444 can grow from undoped silicon layer 442, semiconductor layers 418, and/or sacrificial silicon layer 410; and doped silicon germanium layers 446 can grow from semiconductor layers 418. Undoped silicon layer 442, doped silicon layers 444, and/or doped silicon germanium layers 446 can be formed by epitaxy processes that implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy processes can use gaseous and/or liquid precursors that interact with the composition of semiconductor layers 418, sacrificial silicon layer 412, sacrificial silicon germanium layer 410, and/or undoped silicon layer 442. In some embodiments, doped silicon layers 444 and/or doped silicon germanium layers 446 are doped during deposition by adding dopants to a source material of the epitaxy process. In some embodiments, doped semiconductor layers 444 and/or doped semiconductor layers 446 are doped by an ion implantation process after a deposition process. In some embodiments, annealing processes are performed to activate dopants in doped silicon layers 444, doped silicon germanium layers 446, and/or other source/drain, such as HDD regions and/or LDD regions.

In FIG. 5D, undoped silicon layer 442 is formed in a bottom portion of source/drain recess 430A and partially fills source/drain recess 430A. Undoped silicon layer 442 physically contacts silicon layer 406, sacrificial silicon germanium layer 410, and sacrificial silicon layer 412. A top surface of undoped silicon layer 442 is lower than a top surface of sacrificial silicon layer 412, such that source/drain recess 430A still extends a depth into sacrificial silicon layer 412 after forming undoped silicon layer 442. In the depicted embodiment, a recessed top surface of undoped silicon layer 442 forms a bottom of source/drain recess 430A. In some embodiments, a depth D3 is between top surface of sacrificial silicon layer 412 and the top recessed surface of undoped silicon layer 442, and source/drain recess 430A extends through sacrificial silicon layer 412 and depth D3 into undoped silicon layer 442. In some embodiments, depth D3 is about equal to depth D1 of source/drain recesses 430B, 430C in sacrificial silicon layer 412.

Patterned mask layer 438 (in particular, second mask layer 438B) covers source/drain recess 430B and source/drain recess 430C to prevent formation of undoped silicon layer 442 in source/drain recess 430B and source/drain recess 430C. In some embodiments, undoped silicon layer 442 is formed by epitaxially growing an undoped silicon material in source/drain recess 430A and recessing (etching back) the undoped silicon material by an etching process. In some embodiments, undoped silicon layer 442 is formed by depositing an undoped silicon material over multigate device 400 that at least partially fills source/drain recess 430A and recessing (etching back) the undoped silicon material by an etching process. In some embodiments, first mask layer 438A of patterned mask layer 436 may be removed by the etching process implemented to form undoped silicon layer 442. In some embodiments, patterned mask layer 436 is partially or completely removed by the etching process implemented to extend source/drain recess 430A in FIG. 5C. For example, first mask layer 438A may be partially or completely removed during and/or after the etching process for extending source/drain recess 430A, while second mask layer 438B remains covering sidewalls and bottoms of source/drain recesses 430B, 430C. In some embodiments, patterned mask layer 436 is removed by a suitable process, such as a resist stripping process, after the etching processes.

In FIG. 5E, after removing patterned mask layer 436, doped silicon layers 444 are formed in and partially fills source/drain recesses 430A-430C, dielectric layers 445 are formed over doped silicon layers 444 in source/drain recesses 430A-430C, and doped silicon germanium layers 446 are formed over dielectric layers 445 in source/drain recesses 430A-430C. Doped silicon layers 444 and doped silicon germanium layers 446 form portions of first type transistors (e.g., n-type transistors) and second type transistors (e.g., p-type transistors), respectively. Doped silicon layers 444 and doped silicon germanium layers 446 are thus configured to optimize performance of their respective transistors. For example, for n-type transistors, doped silicon layers 444 are doped with carbon, phosphorous, arsenic, other n-type dopant, or combinations thereof, and for p-type transistors, doped silicon germanium layers 446 are doped with boron, other p-type dopant, or combinations thereof. A thickness of doped silicon layers 444 and a thickness of doped silicon germanium layers 446 depends on a number of channel layers (which correspond with semiconductor layers 418) of their corresponding transistors. In the depicted embodiment, doped silicon layers 444 form portions of transistors having two channel layers (which correspond with bottom and middle semiconductor layers 418 of semiconductor layer stack 415), and doped silicon germanium layers 446 form portions of transistors having one channel layer (which correspond with top semiconductor layers 418 of semiconductor layer stack 415). Accordingly, a thickness of doped silicon layers 444 is greater than a height of top surfaces of middle semiconductor layers 418 relative to top surface of sacrificial silicon layer 412 and less than a height of a bottom surface of top semiconductor layers 418 relative to top surface of sacrificial silicon layer 412, while a thickness of doped silicon germanium layers 446 is greater than a thickness of top semiconductor layers 418.

Before forming doped silicon germanium layers 446, dielectric layers 445 are formed over doped silicon layers 444. Dielectric layers 445 physically contact inner spacers 434 and are positioned to prevent and/or minimize physical contact with semiconductor layers 418. In the depicted embodiment, dielectric layers 445 are positioned between top semiconductor layers 418 and middle semiconductor layers 418. Dielectric layers 445 separate and isolate doped silicon layers 444 and doped silicon germanium layers 446. In some embodiments, dielectric layers 445 are formed by performing an oxidation process to oxidize a portion of doped silicon layers 444, thereby forming silicon oxide layers. In some embodiments, dielectric layers 445 are formed by depositing a dielectric layer over multigate device 400 (in some embodiments, by a conformal deposition process), where dielectric layer is disposed over doped silicon layers 444 and partially fills source/drain recesses 430A-430C, and etching the dielectric layer as depicted in FIG. 5E. In some embodiments, dielectric layers 445 are formed by a bottom-up deposition process. In some embodiments, dielectric layers 445 are formed by selectively growing a dielectric material from doped silicon layers 444. Dielectric layers 445 include silicon oxide, silicon nitride, silicon oxynitride, other suitable isolation material (for example, including silicon, oxygen, nitrogen, carbon, or other suitable isolation constituent), or combinations thereof.

In FIG. 5E, processing can further include forming a contact etch stop layer (CESL) 450 over multigate device 400, forming an interlevel dielectric layer (ILD) layer 452 over CESL 450, and performing a CMP process and/or other planarization process until reaching (exposing) tops of dummy gates 424. CESL 450 and ILD layer 452 are disposed over epitaxial source/drain structures 440A, 440B and between adjacent gate structures 420. CESL 450 and/or ILD layer 452 are formed by CVD, PVD, ALD, RPCVD, PECVD, HDPCVD, FCVD, HARP, LPCVD, ALCVD, APCVD, SACVD, MOCVD, other suitable methods, or combinations thereof. In some embodiments, ILD layer 452 is formed by FCVD, HARP, HDPCVD, or combinations thereof. In some embodiments, the planarization process removes hard masks of dummy gates 424 to expose underlying dummy gate electrodes of dummy gates 424, such as polysilicon gate electrodes. ILD layer 452 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 452 includes a dielectric material having a dielectric constant that is less than a dielectric constant of silicon dioxide (e.g., k<3.9). In some embodiments, ILD layer 452 includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. ILD layer 452 can include a multilayer structure having multiple dielectric materials. CESL 450 includes a material different than ILD layer 452, such as a dielectric material that is different than the dielectric material of ILD layer 452. For example, ILD layer 452 can include a dielectric material that includes silicon and oxygen and has a dielectric constant less than the dielectric constant of silicon dioxide, and CESL 450 can include silicon and nitrogen, such as silicon nitride or silicon oxynitride.

Turning to FIG. 4B and FIG. 5E, method 300 can proceed at block 350 with performing a gate replacement process to replace dummy gates 424 with metal gate stacks (including, for example, gate electrodes 460 and gate dielectrics 462) and performing a channel release process to form suspended channel layers in channel regions of multigate device 400. For example, dummy gates 424 are removed to form gate openings in gate structures 420 that expose channel regions of semiconductor layer stack 415 (e.g., semiconductor layers 418 and semiconductor layers 416). In some embodiments, an etching process is performed that selectively removes dummy gates 424 with respect to ILD layer 452, CESL 450, gate spacers 422, inner spacers 434, semiconductor layers 416, and/or semiconductor layers 418. In other words, the etching process substantially removes dummy gates 424 but does not remove, or does not substantially remove, ILD layer 452, CESL 450, gate spacers 422, inner spacers 434, semiconductor layers 416, and/or semiconductor layers 418. The etching process is a dry etching process, a wet etching process, other suitable etching process, or combinations thereof. In some embodiments, the etching process uses a patterned mask layer as an etch mask, where the patterned mask layer having openings therein that expose dummy gates 424.

During the gate replacement process, before forming metal gate stacks in the gate openings, the channel release process is performed to form the suspended channel layers in channel regions of multigate device 400. For example, semiconductor layers 416 exposed by the gate openings are selectively removed to form air gaps between semiconductor layers 418 and between semiconductor layers 418 and sacrificial silicon layer 412, thereby suspending semiconductor layers 418 in channel regions of multigate device 400. In the depicted embodiment, each channel region of multigate device 400 has three suspended semiconductor layers 418, which are referred to hereafter as channel layers 418', vertically stacked along the z-direction for providing three channels through which current can flow between respective epitaxial source/drain structures during operation of transistors corresponding with the channel regions. In some embodiments, an etching process is performed to selectively etch semiconductor layers 416 with minimal (to no) etching of semiconductor layers 418, sacrificial silicon layer 412, gate spacers 422, inner spacers 434, CESL 450, and/or ILD layer 452. In some embodiments, an etchant is selected for the etch process that etches silicon germanium (i.e., semiconductor layers 416) at a higher rate than silicon (i.e., semiconductor layers 418 and sacrificial silicon layer 412) and dielectric materials (i.e., gate spacers 422, inner spacers 434, CESL 450, and/or ILD layer 452) (i.e., the etchant has a high etch selectivity with respect to silicon germanium). The etching process is a dry etching process, a wet etching process, other suitable etching process, or combinations thereof. In some embodiments, before performing the etching process, an oxidation process can be implemented to convert semiconductor layers 416 into silicon germanium oxide features, where the etching process then removes the silicon germanium oxide features. In some embodiments, during and/or after removing semiconductor layers 416, an etching process is performed to modify a profile of semiconductor layers 418 to achieve target dimensions and/or target shapes for channel layers 418'.

Figure 5F:
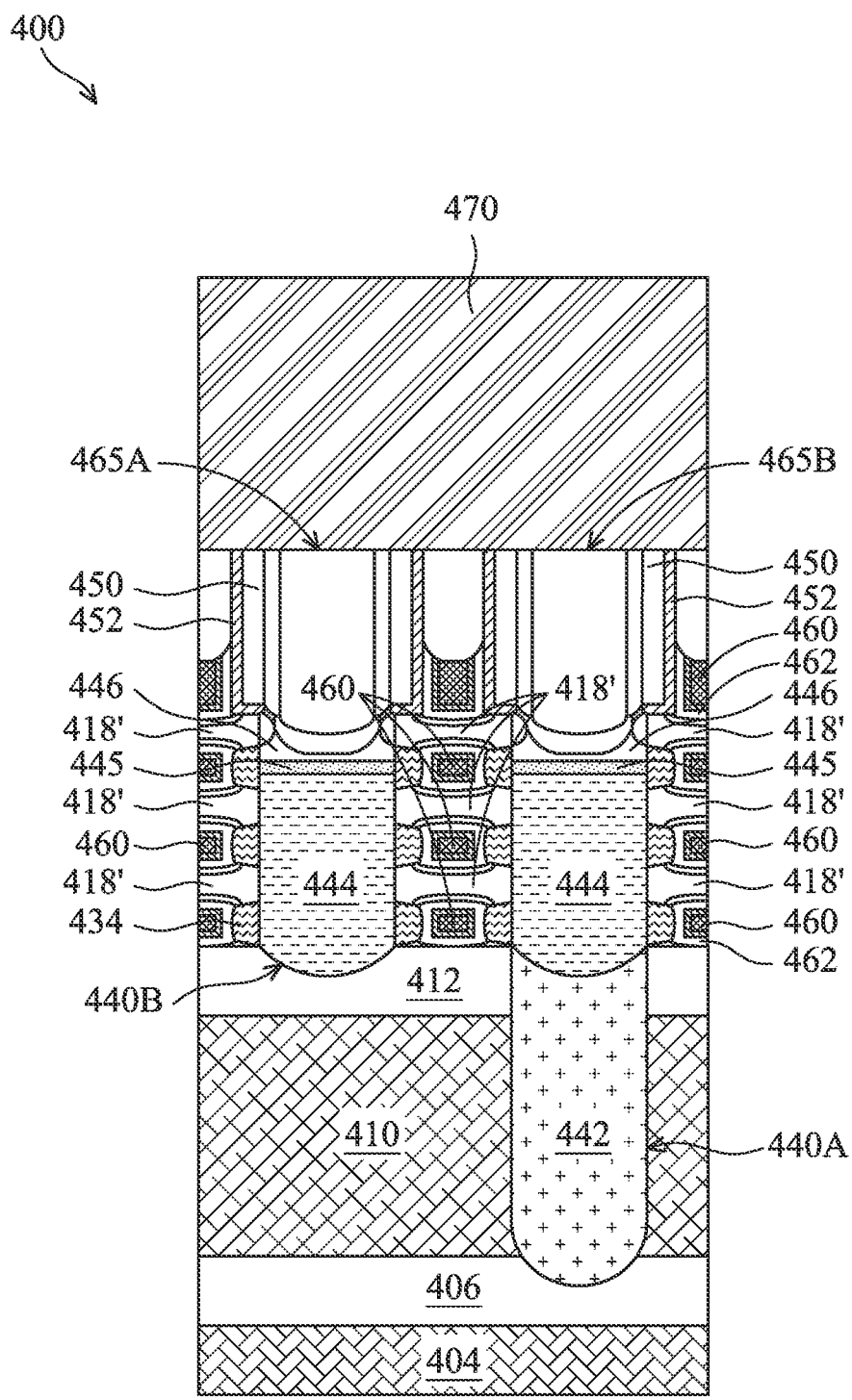

Metal gate stacks are then formed in the gate openings. Metal gate stacks are disposed between respective gate spacers 422. Metal gate stacks are disposed between respective inner spacers 434, between channel layers 418', and between bottom channel layers 418' and sacrificial silicon layer 412. In the depicted embodiment, where multigate device 400 is a GAA transistor, metal gate stacks surround channel layers 418', for example, in the Y-Z plane. In some embodiments, metal gate stacks correspond with metal gates 130A-130D of vertical SRAM 10. In some embodiments, forming metal gate stacks includes depositing a gate dielectric layer over multigate device 400 that partially fills the gate openings, depositing a gate electrode layer over the gate dielectric layer that partially fills the gate openings, depositing a hard mask layer over the gate electrode layer that fills a remainder of the gate openings, and performing a planarization process, such as CMP, on the hard mask layer, the gate electrode layer, and/or the gate dielectric layer, thereby forming metal gate stacks as depicted in FIG. 5F. The deposition processes can include CVD, PVD, ALD, RPCVD, PECVD, HDPCVD, FCVD, HARP, LPCVD, ALCVD, APCVD, SACVD, MOCVD, plating, other suitable methods, or combinations thereof. Though the depicted embodiment fabricates metal gate stacks according to a gate last process, the present disclosure contemplates embodiments where metal gate stacks are fabricated according to a gate first process or a hybrid gate last/gate first process.

Metal gate stacks are configured to achieve desired functionality according to design requirements of multigate device 400, such that metal gate stacks of gate structures 420 may include the same or different layers and/or materials. In some embodiments, as noted above, metal gate stacks include a respective gate dielectric 462 (for example, a gate dielectric layer) and a respective gate electrode 460 (for example, a work function layer and a bulk (or fill) conductive layer). Metal gate stacks may include numerous other layers, for example, capping layers, interface layers, diffusion layers, barrier layers, hard mask layers, or combinations thereof. In some embodiments, gate dielectrics 462 are disposed over (and/or include) an interfacial layer (including a dielectric material, such as silicon oxide), and gate electrodes 460 are disposed over gate dielectrics 462. Gate dielectrics 462 include a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$-$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, gate dielectrics 462 are high-k dielectric layers. Gate electrodes 460 includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the bulk conductive layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, other suitable p-type work function materials, or combinations thereof. The bulk conductive layer includes a suitable conductive material, such as Al, W, Cu, Ti, Ta, polysilicon, metal alloys, other suitable materials, or combinations thereof. Hard masks include any suitable hard mask material, such as any material (e.g., silicon nitride or silicon carbonitride) that can protect metal gate stacks during subsequent processing, such as that associated with forming device-level contacts of an MLI feature.

In FIG. 5F, method 300 can continue at block 355 with forming a frontside routing structure of multigate device 400. For example, processing proceeds with forming frontside device-level contacts, such as metal-to-poly (MP) contacts, which generally refer to contacts to a gate structure (e.g., gate electrodes 460), and metal-to-device (MD) contacts, which generally refer to contacts to an electrically active region of multigate device 400 (e.g., epitaxial source/drain structures 440A and/or epitaxial source/drain structures 440B). Device-level contacts electrically and physically connect IC device features to local contacts (interconnects), which are further described below. For example, frontside source/drain contact 465A and frontside source/drain contact 465B are formed by performing a lithography and etching process (such as described herein) to form contact openings that extend through ILD layer 452 and/or CESL 450 to expose epitaxial source/drain structure 440A and/or epitaxial source/drain structure 440B, respectively; performing a first deposition process to form a contact barrier material over ILD layer 452 that partially fills the contact openings; and performing a second deposition process to form a contact bulk material over the contact barrier material, where the contact bulk material fills a remainder of the contact openings. In such embodiments, the contact barrier material and the contact bulk material are disposed in the contact opening and over a top surface of ILD layer 452. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, a silicide layer is formed over epitaxial source/drain structure 440A and/or epitaxial source/drain structures 440B before forming the contact barrier material (e.g., by depositing a metal layer over epitaxial source/drain structure 440A and/or epitaxial source/drain structures 440B and heating multigate device 400 to cause constituents of epitaxial source/drain structure 440A and/or epitaxial source/drain structures 440B to react with metal constituents of the metal layer). In some embodiments, the silicide layer includes a metal constituent (e.g., nickel, platinum, palladium, vanadium, titanium, cobalt, tantalum, ytterbium, zirconium, other suitable metal, or combinations thereof) and a constituent of epitaxial source/drain structure 440A and/or epitaxial source/drain structures 440B (e.g., silicon and/or germanium). A CMP process and/or other planarization process is performed to remove excess contact bulk material and contact barrier material, for example, from over the top surface of ILD layer 452, resulting in frontside source/drain contact 465A and frontside source/drain contact 465B (in other words, the contact barrier layer and the contact bulk layer filling the contact openings). The CMP process planarizes a top surface of frontside source/drain contacts 465A, 465B, such that in some embodiments, a top surface of ILD layer 452 and top surfaces of frontside source/drain contacts 465A, 465B form a substantially planar surface.

Frontside source/drain contact 465A and frontside source/drain contact 465B each extend through ILD layer 452 and/or CESL 450 to physically contact epitaxial source/drain structure 440A and epitaxial source/drain structure 440B, respectively. In some embodiments, frontside source/drain contacts 465A, 465B correspond with frontside source/drain contacts 150A-150C of vertical SRAM 10. The contact barrier layer includes a material that promotes adhesion between a surrounding dielectric material (e.g., ILD layer 452 and/or CESL 450) and the contact bulk layer. The material of the contact barrier layer may further prevent diffusion of metal constituents from frontside source/drain contacts 465A, 465B into the surrounding dielectric material. In some embodiments, the contact barrier layer includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, the contact barrier layer includes multiple layers. For example, the contact barrier layer may include a first sub-layer that includes titanium or tantalum and a second sub-layer that includes titanium nitride or tantalum nitride. The contact bulk layer includes tungsten, ruthenium, cobalt, copper, aluminum, iridium, palladium, platinum, nickel, low resistivity metal constituent, alloys thereof, or combinations thereof. In some embodiments, frontside source/drain contacts 465A, 465B do not include a contact barrier layer (i.e., frontside source/drain contacts 465A, 465B are barrier-free) or frontside source/drain contacts 465A, 465B are partially barrier-free, where the contact barrier layer is disposed between a portion of the contact bulk layer and the dielectric layer. In some embodiments, the contact bulk layer includes multiple layers.

Processing can continue with forming additional features of the frontside routing structure, such as a frontside BEOL structure 470. Frontside BEOL structure 470 can include additional metallization layers (levels) of the frontside routing structure, such as a first metallization layer (i.e., a metal one (M1) layer and a via zero (V0) layer), a second metallization layer (i.e., a metal two (M2) layer and a via one (V1) layer) . . . to a topmost metallization layer (i.e., a metal X (MX) layer and a via Y (VY) layer, where X is a total number of patterned metal line layers of frontside BEOL structure 470 and Y is a total number of patterned via layers of frontside BEOL structure 470) over the first metallization layer. Each metallization layer includes a patterned metal line layer and a patterned via layer configured to provide at least one BEOL interconnect structure disposed in an insulator layer, which includes at least one ILD layer and/or at least one CESL similar to the ILD layers and the CESLs described herein. The patterned metal line layer and the patterned metal via layer can be formed by any suitable process, including by a dual damascene process, and include any suitable materials and/or layers. In some embodiments, conductive features of frontside BEOL structure 470 correspond with source/drain vias 160A-160C, gate vias 165A-165D, and metal lines 170A-170D.

Figure 5G:
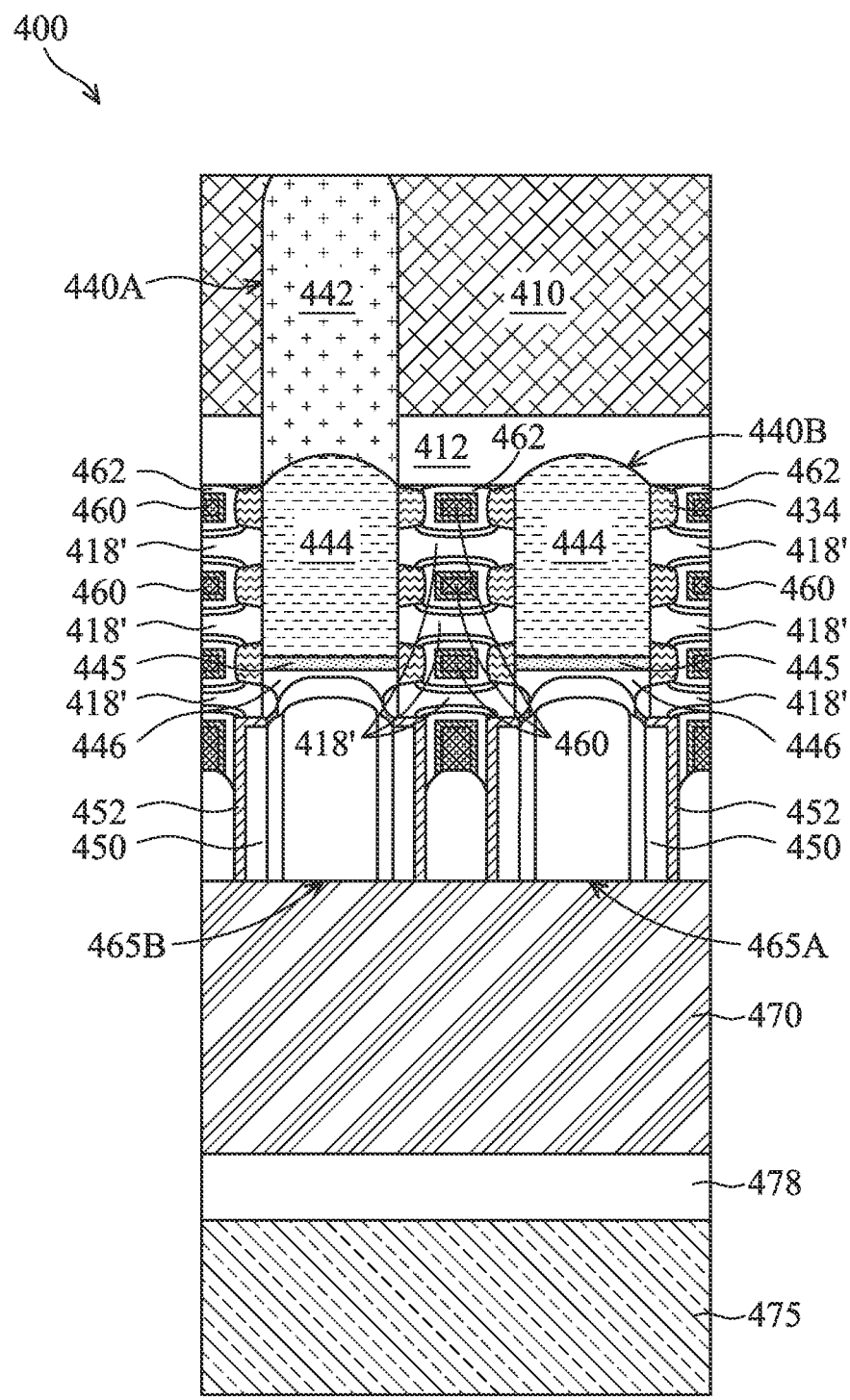

Turning to FIG. 4B and FIGS. 5G-5I, method 300 proceeds at block 360 with replacing a semiconductor substrate (e.g., sacrificial silicon layer 412, sacrificial silicon germanium layer 410, and/or a remainder of SOI substrate 402) with a dielectric substrate. In FIG. 5G, a carrier wafer 475 (also referred to as a carrier substrate) is bonded and/or attached to a frontside of a device wafer (e.g., a wafer including multigate device 400) by a bonding layer 478. The device wafer is then flipped over and a remainder of SOI substrate 402 (here, insulator layer 404 and silicon layer 406) is removed from multigate device 400 by CMP and/or other suitable planarization process, thereby exposing sacrificial silicon germanium layer 410 and undoped silicon layer 442 of epitaxial source/drain structure 440A disposed therein. In some embodiments, the CMP process stops upon reaching undoped silicon layer 442 (i.e., undoped silicon layer 442 is a CMP stop layer). In some embodiments, the remainder of SOI substrate 402 is removed by an etching process, such as those described herein. In some embodiments, the device wafer is bonded to carrier wafer 475 using dielectric-to-dielectric bonding. For example, bonding carrier wafer 475 to the device wafer can include forming a first dielectric layer over BEOL structure 470 of multigate device 400, forming a second dielectric layer over carrier wafer 475, flipping over and placing carrier wafer 475 over the device wafer, such that the second dielectric layer of carrier wafer 475 contacts the first dielectric layer of the device wafer, and performing an anneal or other suitable process to bond the first dielectric layer and the second dielectric layer. In some embodiments, bonding layer 478 represents the first dielectric layer, the second dielectric layer, a portion of the first dielectric layer, a portion of the second dielectric layer, a bonded portion of the first dielectric layer and the second dielectric layer, or combinations thereof. In some embodiments, bonding layer 478 is an oxide layer that attaches carrier wafer 475 to frontside BEOL structure 470. In some embodiments, carrier wafer 475 includes silicon, soda-lime glass, fused silica, fused quartz, calcium fluoride, and/or other suitable carrier wafer materials.

Figure 5H:
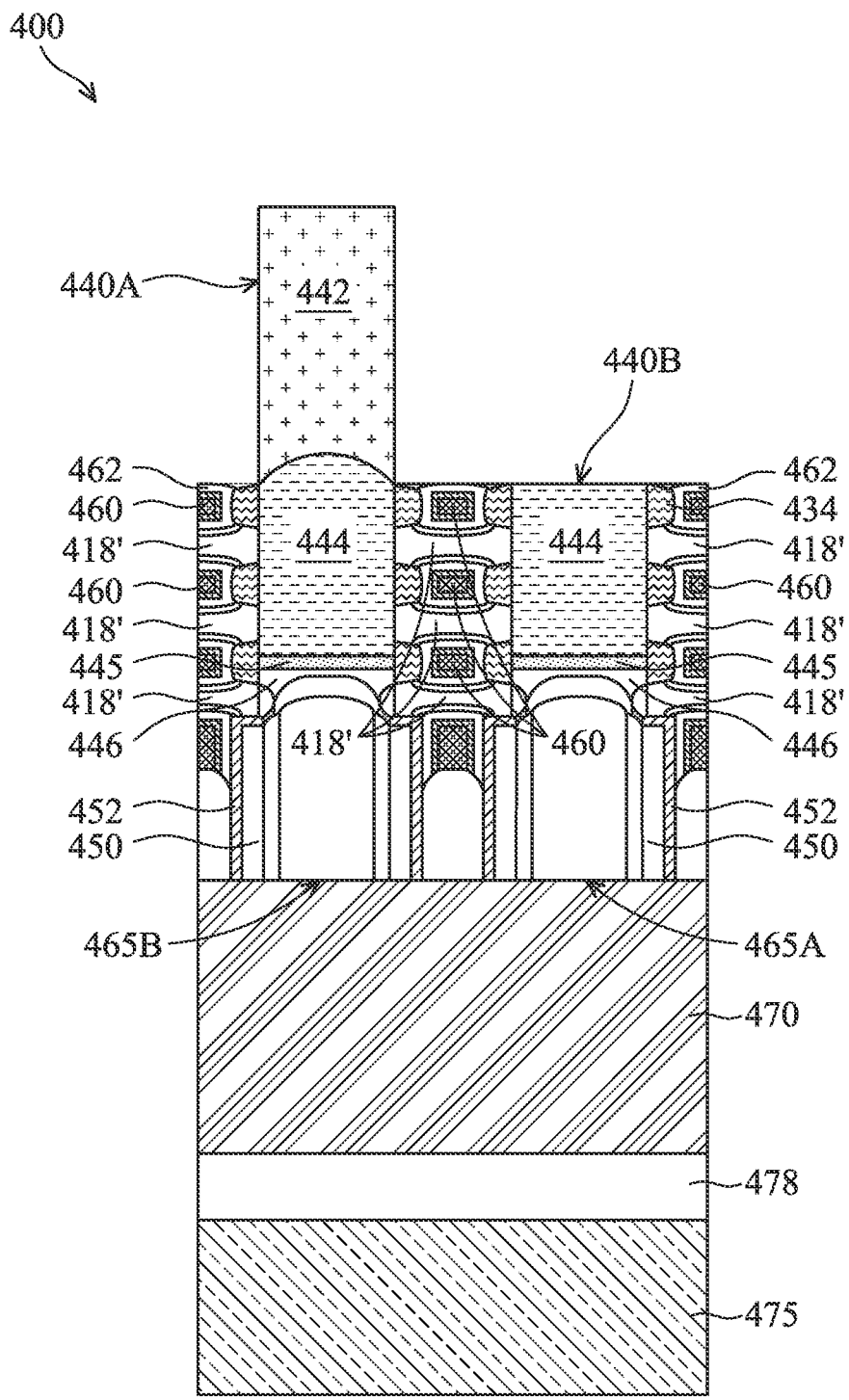
Figure 5I:
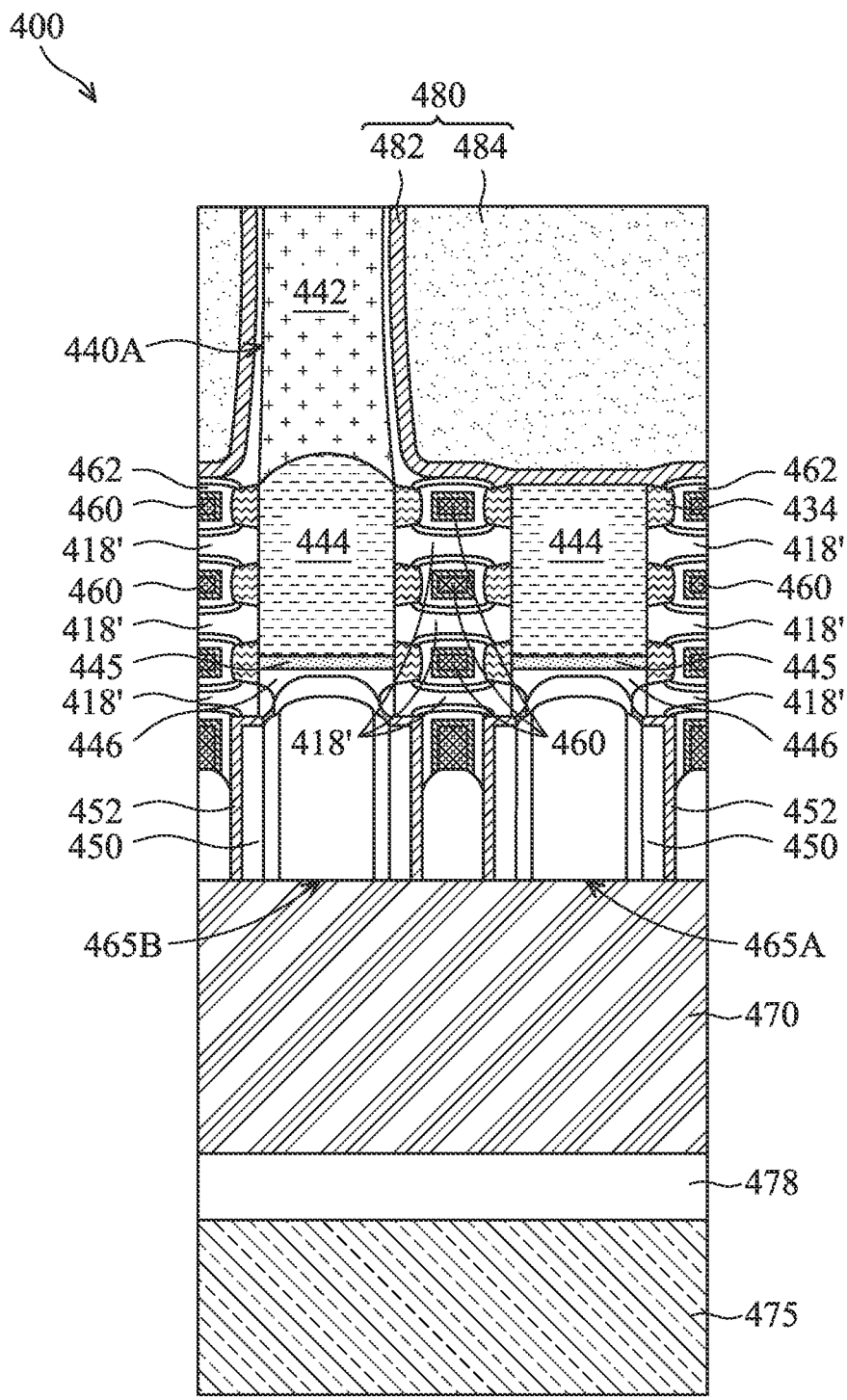

Turning to FIG. 5H and FIG. 5I, a semiconductor substrate (e.g., sacrificial silicon germanium layer 410 and sacrificial silicon layer 412) is replaced with a dielectric substrate, such as a dielectric substrate 480, which includes a dielectric liner 482 and a dielectric layer 484. In some embodiments, dielectric substrate 480 corresponds with substrate 100 and/or dielectric layers 145 in vertical SRAM 10. In FIG. 5H, remainders of sacrificial silicon germanium layer 410 and sacrificial silicon layer 412 are removed from multigate device 400 by an etching process, thereby exposing epitaxial source/drain structure 440A, epitaxial source/drain structure 440B, inner spacers 434, and gate electrodes 460. The etching process completely removes sacrificial silicon germanium layer 410 and sacrificial silicon layer 412 and portions of epitaxial source/drain structure 440B disposed in sacrificial silicon layer 412, such as doped silicon layer 444 of epitaxial source/drain structure 440B. The etching process is a dry etching process, a wet etching process, other suitable etching process, or combinations thereof. The etching process selectively etches sacrificial silicon germanium layer 410, sacrificial silicon layer 412, and epitaxial layers 444 with minimal (to no) etching of undoped silicon layer 442 of epitaxial source/drain structure 440A. Accordingly, a bottom of epitaxial source/drain structure 440B is recessed by the etching process, such that the bottom of epitaxial source/drain structure 440B is substantially planar with or recessed from a bottom of metal gate stacks, while a bottom of epitaxial source/drain structure 440A extends beyond a bottom of metal gate stacks. In such embodiments, undoped silicon layer 442 masks doped silicon layer 444 of epitaxial source/drain structure 440A, and a portion of doped silicon layer 444 of epitaxial source/drain structure 440A disposed in sacrificial silicon layer 412 remains after the etching process. In some embodiments, the etching process recesses (etches back) undoped silicon layer 442 of epitaxial source/drain structure 440A, such that a thickness of undoped silicon layer 442 after the etching process is less than a thickness of undoped silicon layer 442 before the etching process. In some embodiments, an etchant is selected for the etching process that etches doped semiconductor materials (e.g., doped silicon (i.e., sacrificial silicon layer 412 and epitaxial layers 444) and doped silicon germanium (i.e., sacrificial silicon germanium sacrificial layer 410) at a higher rate than undoped semiconductor materials (i.e., undoped silicon layer 442) (i.e., the etchant has a high etch selectivity with respect to doped silicon and doped silicon germanium). In some embodiments, the etching process is a multi-step etch process. For example, the etching process may alternate etchants to separately and alternately remove sacrificial silicon germanium layer 410 and sacrificial silicon layer 412. In some embodiments, a lithography process, such as those described herein, is performed to form a patterned mask layer that covers epitaxial source/drain structure 440A, and the etching process uses the patterned mask layer as an etch mask.

Thereafter, a dielectric liner is deposited over the backside of multigate device 400 (which, in some embodiments, partially fills a trench formed by the etching process), a dielectric layer is deposited over the dielectric liner (which, in some embodiments, fills a remainder of the trench), and a CMP process and/or other planarization process is performed on the dielectric layer and the dielectric liner. A remainder of the dielectric layer and a remainder of the dielectric liner after the CMP process form dielectric layer 484 and dielectric liner 482, respectively, of dielectric substrate 480. The dielectric liner physically contacts epitaxial source/drain structure 440A, epitaxial source/drain structure 440B, inner spacers 434, and metal gate stacks. The dielectric liner and the dielectric layer are deposited by any suitable deposition process, such as CVD, PVD, ALD, HDPCVD, FCVD, HARP, MOCVD, RPCVD, PECVD, LPCVD, ALCVD, APCVD, SACVD, or combinations thereof. In some embodiments, the dielectric liner is formed by ALD and the dielectric layer is formed by CVD. The dielectric liner and the dielectric layer each include a dielectric material including, for example, silicon, oxygen, nitrogen, carbon, other suitable dielectric constituent, or combinations thereof. The dielectric material of the dielectric liner is different than the dielectric material of the dielectric layer. In some embodiments, the dielectric liner includes a nitrogen-comprising dielectric material, such as a dielectric material that includes nitrogen in combination with silicon, carbon, and/or oxygen. In such embodiments, the dielectric liner can be referred to as a nitride liner or a silicon nitride liner. For example, the dielectric liner includes silicon nitride, silicon carbon nitride, silicon oxycarbonitride, or combinations thereof. In some embodiments, the dielectric liner includes n-type dopants and/or p-type dopants. For example, the dielectric liner can be a boron-doped nitride liner. In some embodiments, the dielectric liner includes a low-k dielectric material. In some embodiments, the dielectric liner includes BSG, PSG, and/or BPSG. In some embodiments, the dielectric layer includes an oxygen-comprising dielectric material, such as a dielectric material that includes oxygen in combination with another chemical element, such as silicon. For example, the dielectric layer is an oxide layer, such as a silicon oxide layer. In some embodiments, the dielectric layer and the dielectric liner include different low-k dielectric materials.

Figure 5J:
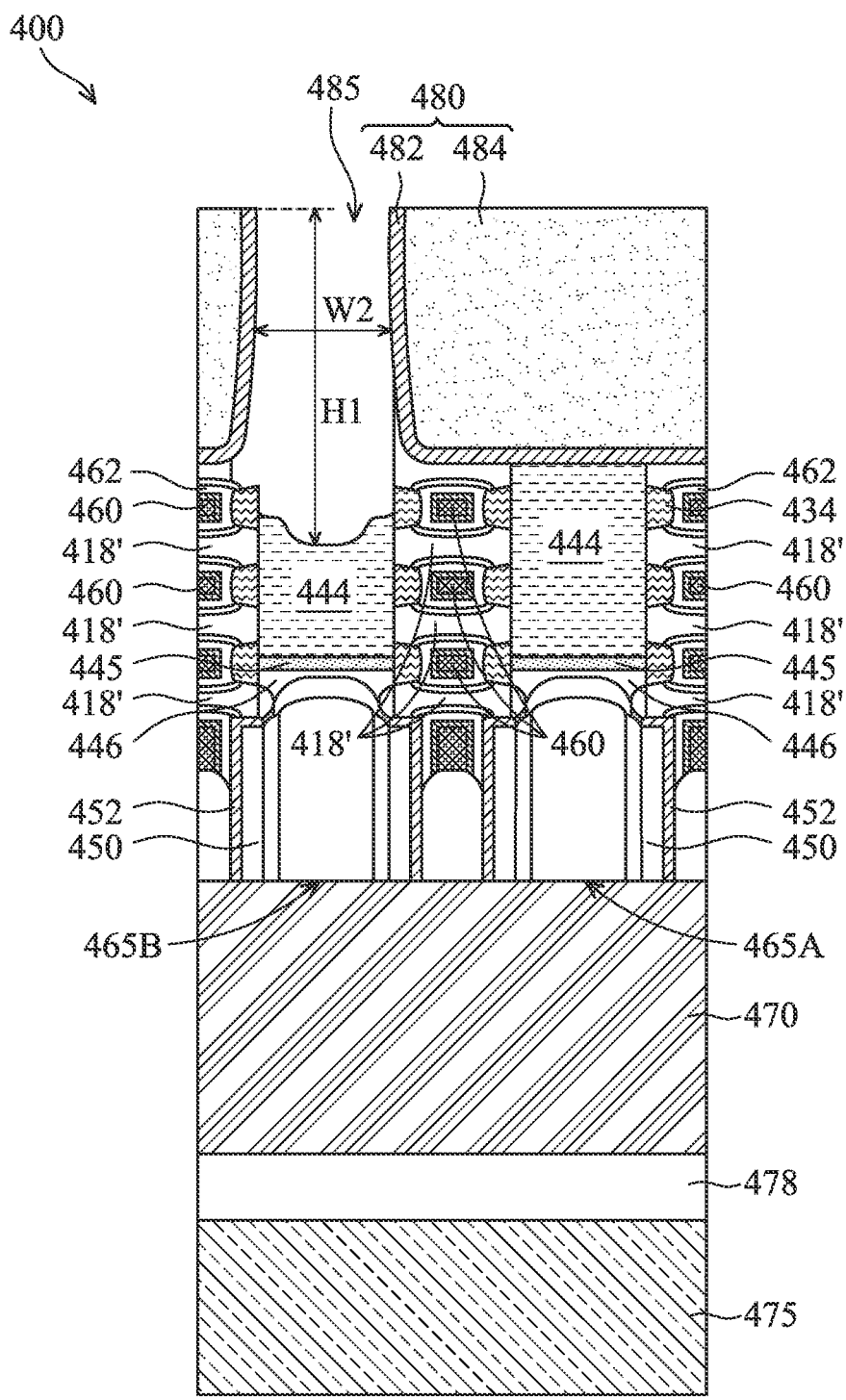
Figure 5K:
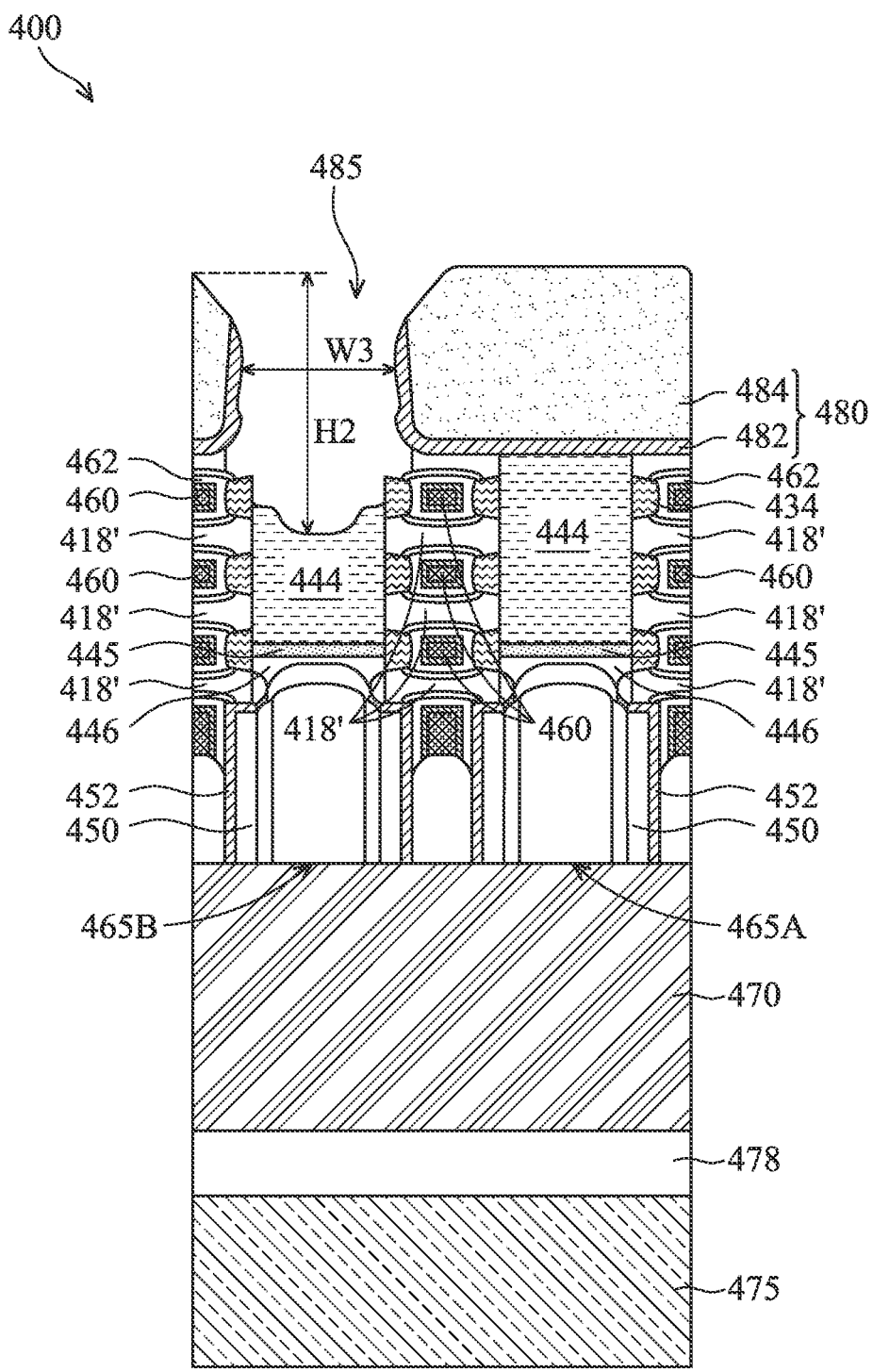
Figure 5L:
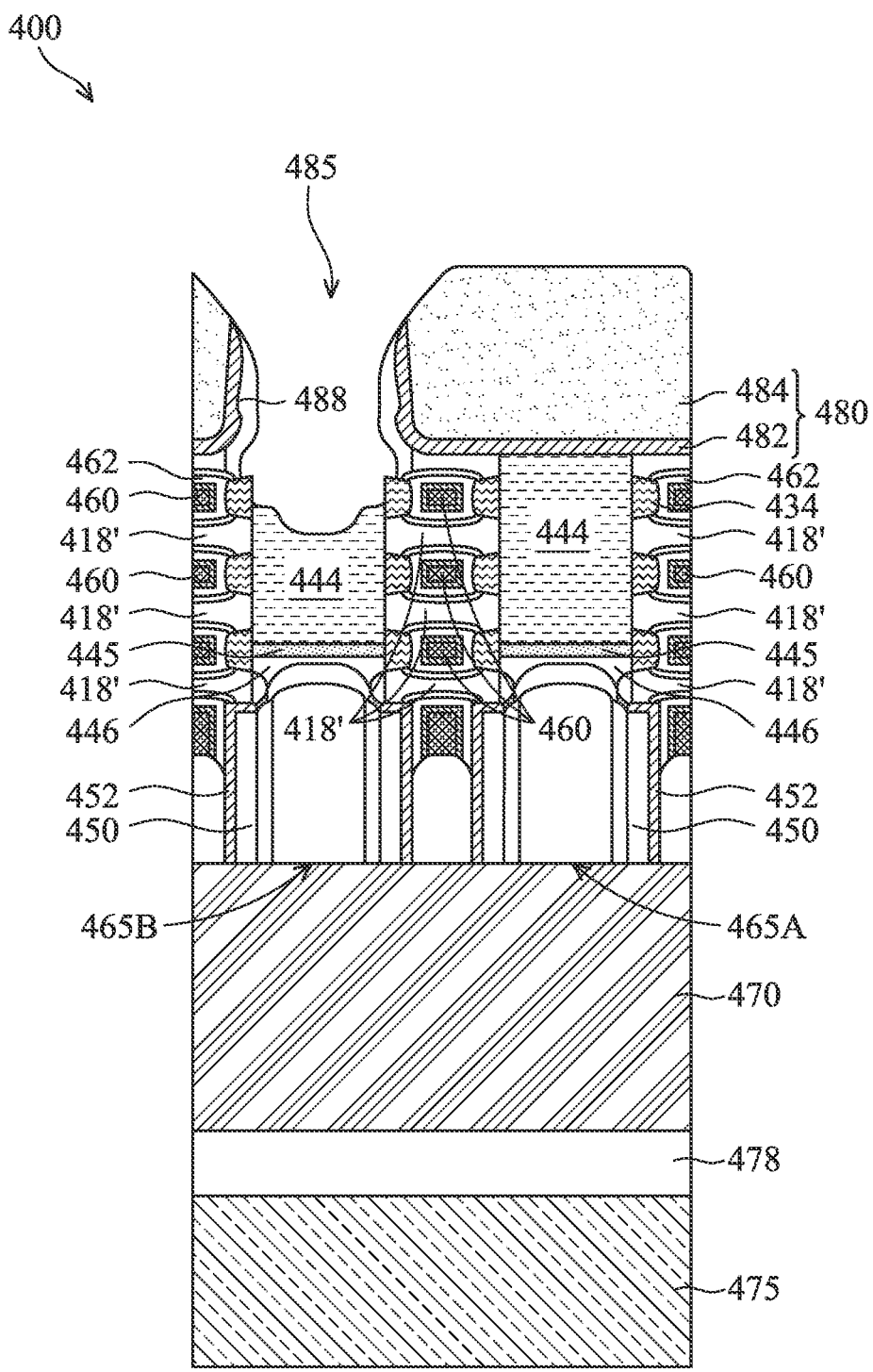
Figure 5M:
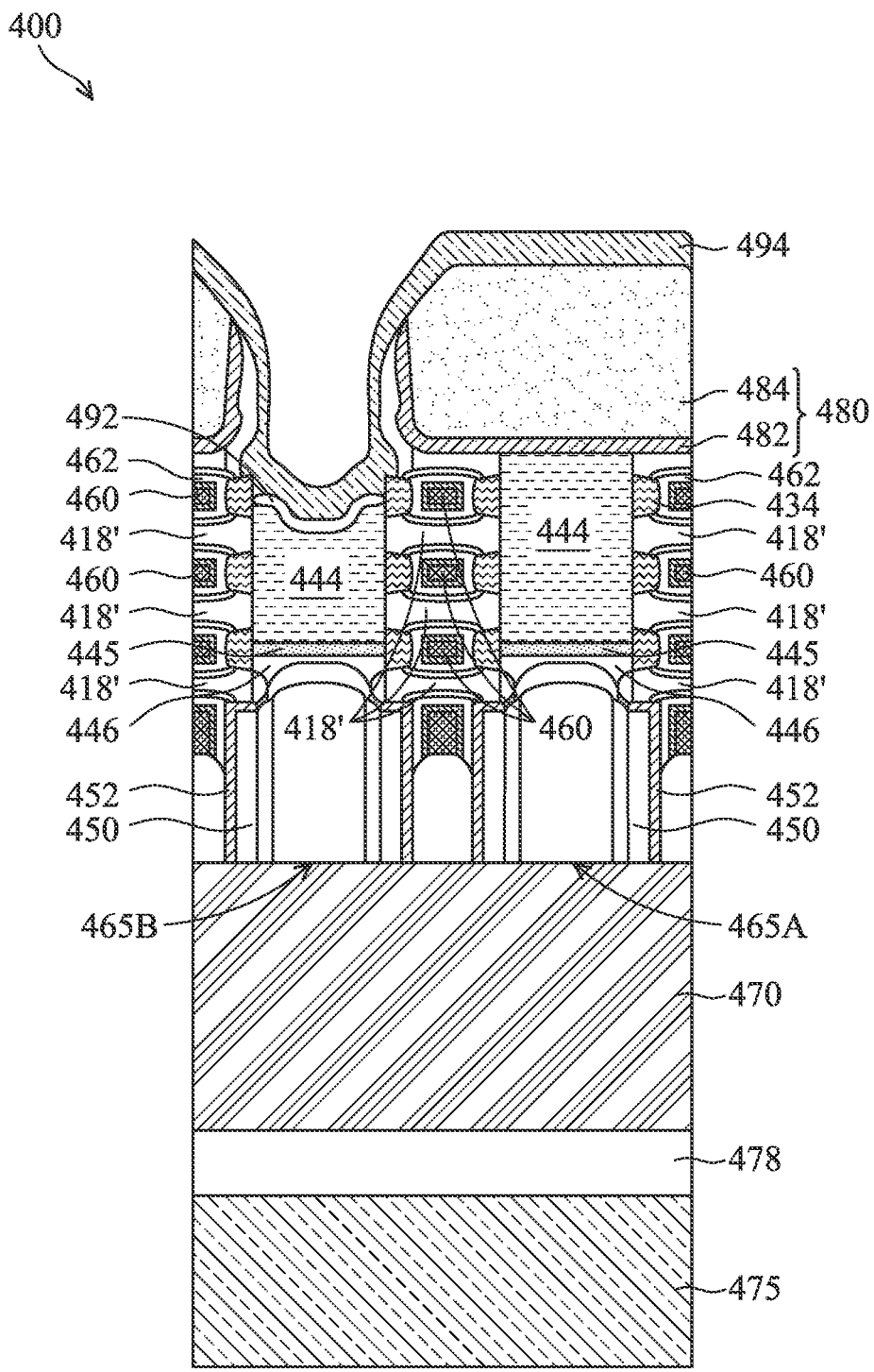
Figure 5N:
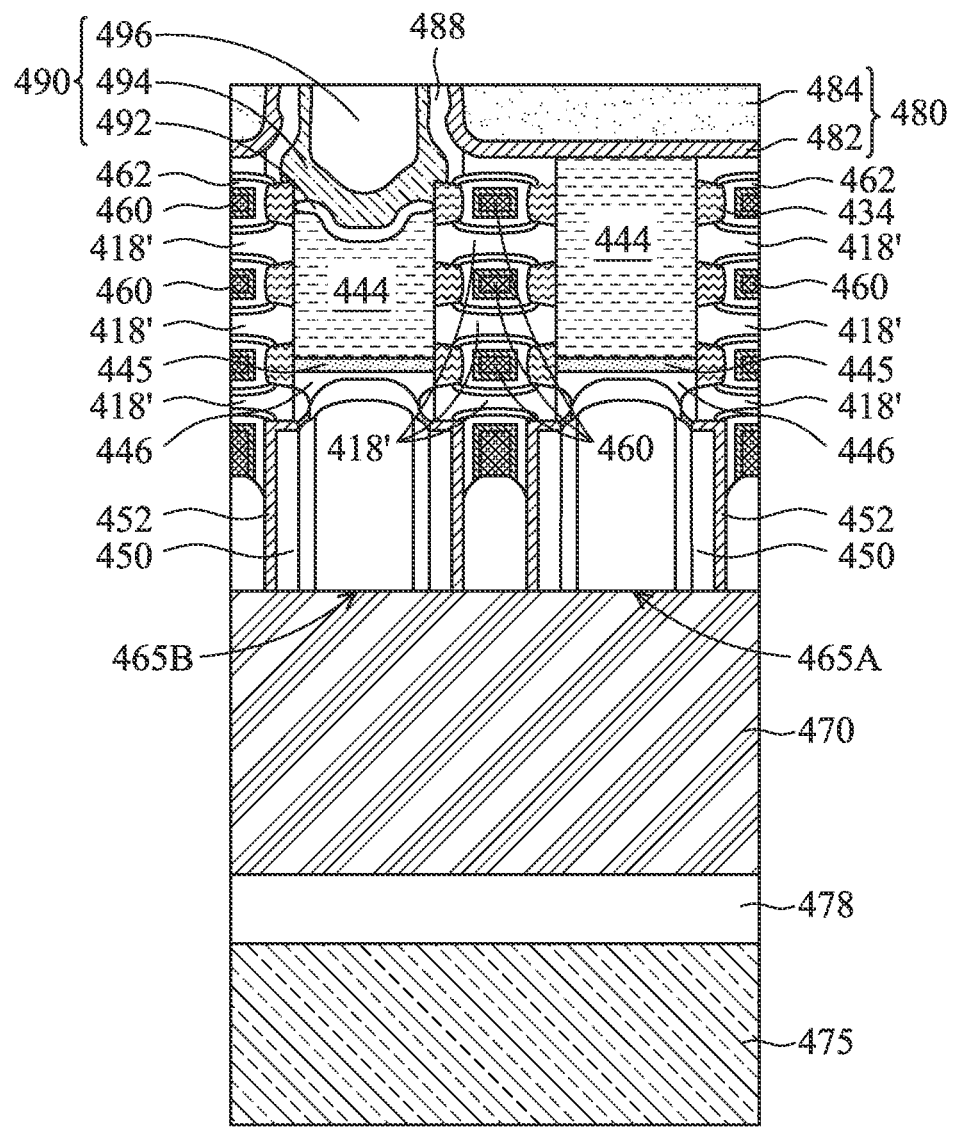
Figure 5O:
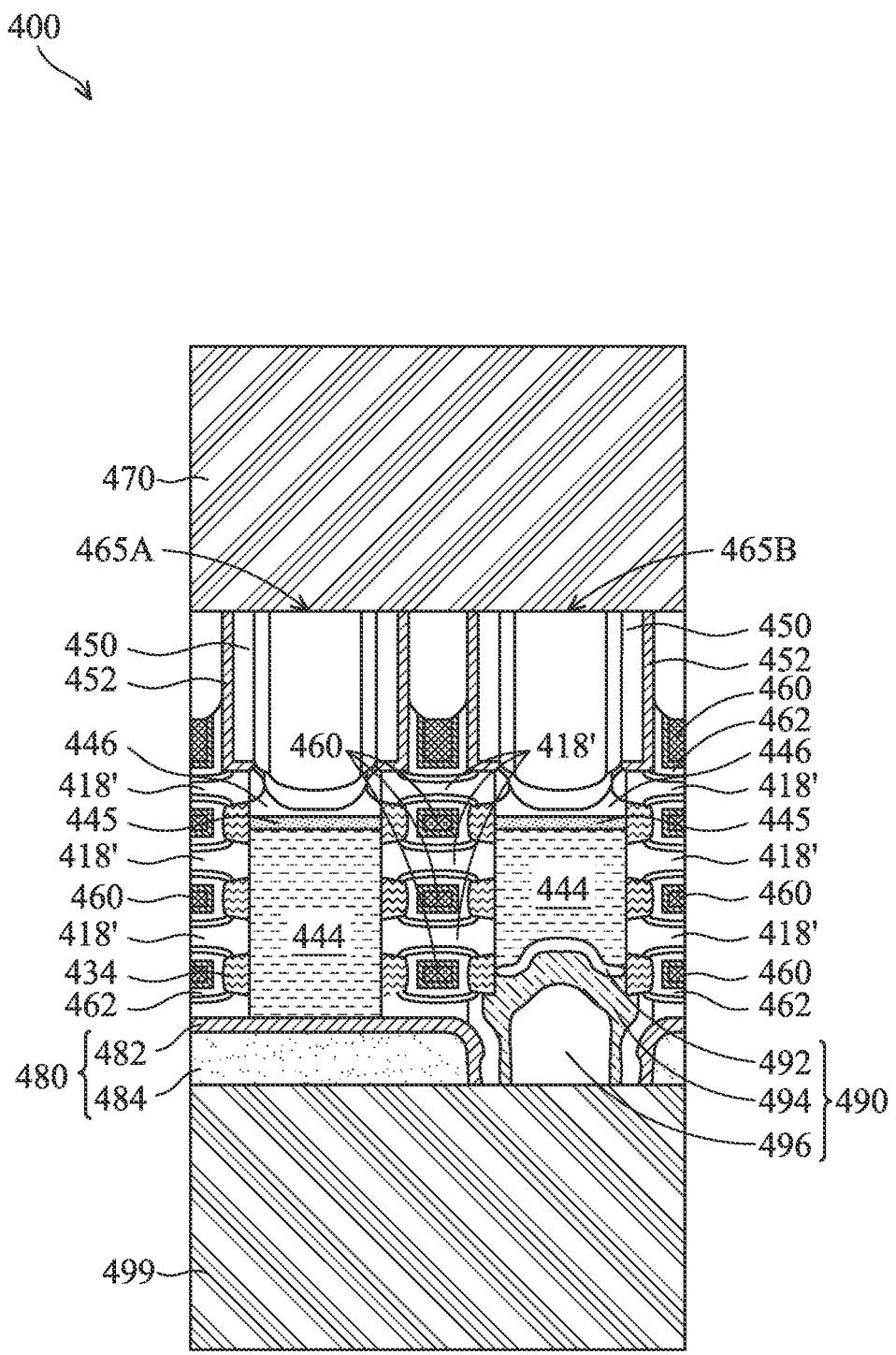

Turning to FIG. 4B and FIGS. 5J-5O, method 300 proceeds at block 365 with forming a backside routing structure of multigate device 400. In FIGS. 5J-5N, processing can include forming backside device-level contacts, such as a backside source/drain contact to epitaxial source/drain structure 440A. For example, in FIG. 5J, an etching process removes undoped silicon layer 442 from epitaxial source/drain structure 440A, thereby forming a contact opening 485 in dielectric substrate 480 that exposes a backside of epitaxial source/drain structure 440A (in particular, doped silicon layer 444). The etching process is a dry etching process, a wet etching process, other suitable etching process, or combinations thereof. The etching process selectively etches undoped silicon layer 442 with minimal (to no) etching of dielectric materials (e.g., dielectric liner 482 and dielectric layer 484 of dielectric substrate 480). In some embodiments, an etchant is selected for the etching process that etches undoped silicon (e.g., undoped silicon layer 442) at a higher rate than doped silicon (e.g., doped silicon layer 444) and dielectric materials (i.e., dielectric substrate 480) (i.e., the etchant has a high etch selectivity with respect to undoped silicon). In some embodiments, a bottom of epitaxial source/drain structure 440A is recessed by the etching process, and the bottom of epitaxial source/drain structure 440A is substantially planar with or recessed (such as depicted in FIG. 5J) from bottoms of metal gate stacks. In some embodiments, a recessed distance between the bottoms of metal gate stacks and the bottom of doped silicon layer 444 of epitaxial source/drain structure 440A is greater than a recessed distance between the bottoms of metal gate stacks and the bottom of doped silicon layers 444 of epitaxial source/drain structure 440B. In some embodiments, a lithography process, such as those described herein, is performed to form a patterned mask layer that covers dielectric substrate 480, and the etching process uses the patterned mask layer as an etch mask.

In FIG. 5K, a profile of contact opening 485 is modified by any suitable process. For example, after removing undoped silicon layer 442, contact opening 485 has a height H1 and a width W1 (FIG. 5J), and after modifying the profile of contact opening 485, contact opening has a height H2 that is less than H1 and a width W2 that is greater than width W1 (FIG. 5K). In some embodiments, contact opening 485 has substantially straight sidewalls formed by dielectric liner 482, and a modification process removes portions of dielectric liner 482 and dielectric layer 484, such that contact opening 485 has curved sidewalls formed by dielectric liner 482 and dielectric layer 484. In some embodiments, a modification process is performed to reduce an aspect ratio of contact opening 485 (i.e., a ratio of height to width of contact opening 485) to improve filling of contact opening 485 with subsequently formed metal layers. In some embodiments, the modification process is an etching process that selectively removes dielectric materials (i.e., dielectric liner 482 and/or dielectric layer 484) with minimal (to no) removal of semiconductor materials (e.g., doped semiconductor layer 444). In FIG. 5L, contact sidewall spacers 488 are then formed along sidewalls of contact opening 485 by any suitable process. Contact sidewall spacers 488 include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonitride). In the depicted embodiment, contact sidewall spacers 488 are silicon nitride layers. In some embodiments, such as depicted, contact sidewall spacers 488 are disposed on dielectric liner 482, but not dielectric layer 484. In some embodiments, contact sidewall spacers 488 are disposed on dielectric liner 482 and dielectric layer 484.

Turning to FIG. 5M and FIG. 5N, a backside source/drain contact 490 is formed in contact opening 485. Backside source/drain contact 490 extends through dielectric substrate 480 to physically contact epitaxial source/drain structure 440A. In some embodiments, backside source/drain contact 490 corresponds with backside source/drain contacts 180A-180C in vertical SRAM 10. In some embodiments, fabricating backside source/drain contact 490 includes forming a silicide layer 492 over doped silicon layer 444 of epitaxial source/drain structure 440A (FIG. 5M)(e.g., by depositing a metal layer over epitaxial source/drain structure 440A and heating multigate device 400 to cause constituents of epitaxial source/drain structure 440A to react with metal constituents of the metal layer); performing a first deposition process to form a contact barrier material over dielectric substrate 480 that partially fills contact opening 485 (FIG. 5M); performing a second deposition process to form a contact bulk material over the contact barrier material, where the contact bulk material fills a remainder of contact opening 485; and performing a CMP process and/or other planarization process to remove excess contact bulk material and contact barrier material, for example, from over a top surface of dielectric substrate 480, resulting in backside source/drain contact 490 having a contact barrier layer 494 and a contact bulk layer 496. The CMP process planarizes a top surface of backside source/drain contacts 490, such that in some embodiments, a top surface of dielectric substrate 480 and a top surfaces of backside source/drain contact 490 form a substantially planar surface. In some embodiments, silicide layer 492 includes a metal constituent (e.g., nickel, platinum, palladium, vanadium, titanium, cobalt, tantalum, ytterbium, zirconium, other suitable metal, or combinations thereof) and a constituent of epitaxial source/drain structure 440A (e.g., silicon and/or germanium). The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. Contact barrier layer 494 includes a material that promotes adhesion between a surrounding dielectric material (e.g., dielectric substrate 480) and contact bulk layer 496. The material of contact barrier layer 494 may further prevent diffusion of metal constituents from backside source/drain contact 490 into the surrounding dielectric material. In some embodiments, contact barrier layer 494 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 494 includes multiple layers, such as a first sub-layer that includes titanium or tantalum and a second sub-layer that includes titanium nitride or tantalum nitride. Contact bulk layer 496 includes tungsten, ruthenium, cobalt, copper, aluminum, iridium, palladium, platinum, nickel, low resistivity metal constituent, alloys thereof, or combinations thereof. In some embodiments, backside source/drain contact 490 does not include a contact barrier layer or backside source/drain contact 490 is partially barrier-free. In some embodiments, the contact bulk layer includes multiple layers.

In FIG. 5O, processing can continue with forming additional features of the backside routing structure, such as a backside BEOL structure 499. Backside BEOL structure 499 can include additional metallization layers (levels) of the backside routing structure, such as a first metallization layer (i.e., a metal one (M1) layer), a second metallization layer (i.e., a metal two (M2) layer and a via one (V1) layer) . . . to a topmost metallization layer (i.e., a metal J (MJ) layer and a via K (VK) layer, where J is a total number of patterned metal line layers of backside BEOL structure 499 and K is a total number of patterned via layers of backside BEOL structure 499) over the first metallization layer. Each metallization layer includes a patterned metal line layer and a patterned via layer configured to provide at least one BEOL interconnect structure disposed in an insulator layer, which includes at least one ILD layer and/or at least one CESL similar to the ILD layers and the CESLs described herein. The patterned metal line layer and the patterned metal via layer can be formed by any suitable process, including by a dual damascene process, and include any suitable materials and/or layers. In some embodiments, conductive features of backside BEOL structure 499 correspond with metal lines 185A-185C.

In FIG. 5O, carrier wafer 475 is removed from the frontside of the device wafer, such as from the frontside of multigate device 400. In some embodiments, such as depicted, bonding layer 478 is also removed from the frontside of the device wafer. In some embodiments, a planarization technique, such as CMP, is used to remove carrier wafer 475 and/or bonding layer 478 from the device wafer. The present disclosure contemplates other methods and/or techniques for removing carrier wafer 475 and/or bonding layer 478 from the device wafer. In some embodiments, carrier wafer 475 and/or bonding layer 478 are removed from the device wafer earlier in processing, such as before processing associated with any one of FIGS. 5J-5N.

Figure 6:
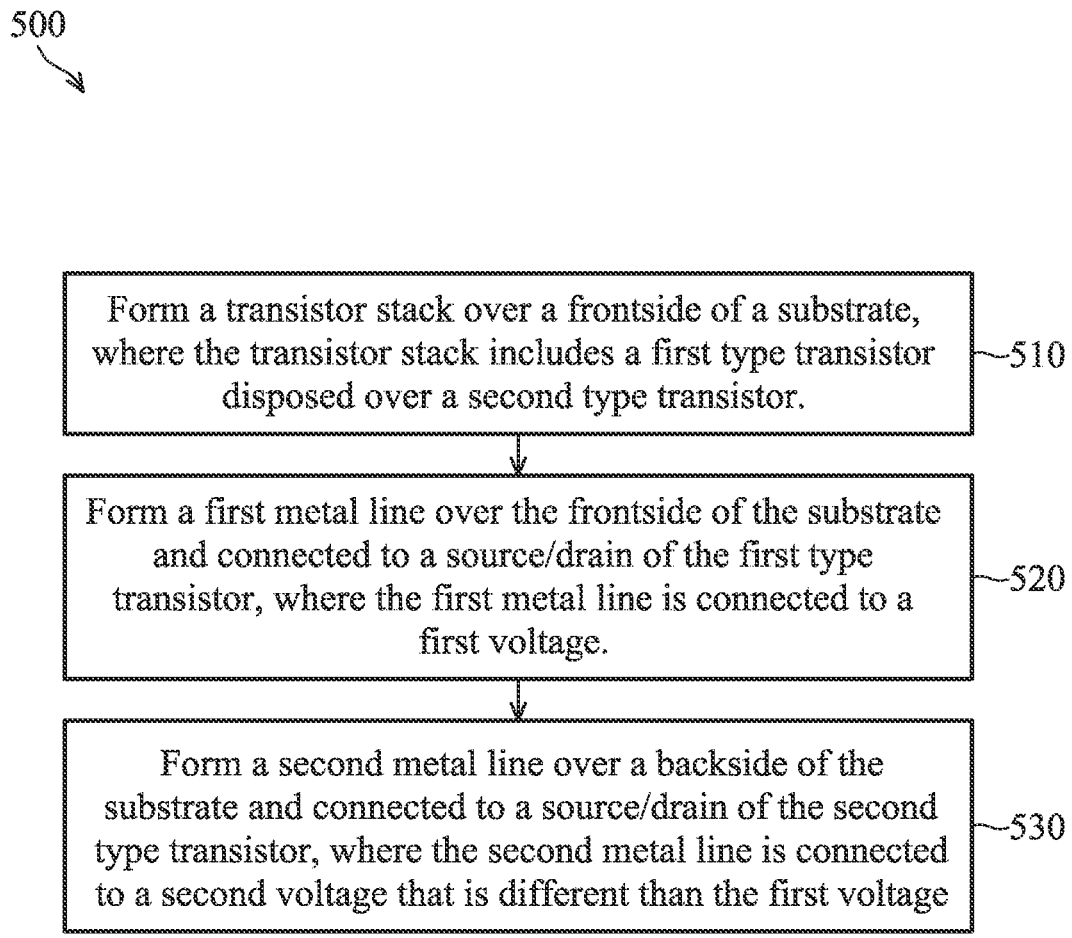
FIG. 6 is a flow chart of a method for fabricating a multigate device, in portion or entirety, of a vertical SRAM, according to various aspects of the present disclosure.

FIG. 6 is a flow chart of a method 500 for fabricating a multigate device, in portion or entirety, of a vertical SRAM according to various aspects of the present disclosure. FIG. 6 has been simplified for the sake of clarity to better understand the inventive concepts of the present disclosure. Method 500 begins with forming a transistor stack over a frontside of a substrate at block 510. The transistor stack includes a first type transistor (e.g., PFET) disposed over a second type transistor (e.g., NFET). The transistor stack can be configured and fabricated as described herein. In some embodiments, the first type transistor and the second type transistor share a metal gate. In some embodiments, the first type transistor includes a first channel layer between first source/drains, the second type transistor includes a second channel layer between second source/drains, the first channel layer is vertically above the second channel layer, the first source/drains are vertically above the second source/drains, and the metal gate wraps the first channel layer and the second channel layer. In some embodiments, the first source/drains are separated from second source/drains by a dielectric layer. Method 500 includes forming a first metal line over the frontside of the substrate and connected to a source/drain of the first type transistor at block 520. The first metal line is connected to a first voltage. Method 500 includes forming a second metal line over a backside of the substrate and connected to a source/drain of the second type transistor at block 530. The second metal line is connected to a second voltage that is different than the first voltage. The first metal line and/or the second metal line can be configured and fabricated as described herein. In some embodiments, the second metal line is a bit line or a bit line bar. In some embodiments, the first metal line is a voltage line. Additional steps can be provided before, during, and after method 500, and some of the steps described can be moved, replaced, or eliminated for additional embodiments of method 500.

The present disclosure provides for many different embodiments. A four times contacted poly pitch (4CPP) static random-access memory (SRAM) cell layout is disclosed herein that forms six SRAM transistors from one OD region and four poly lines at a frontside of a substrate and provides a double-sided routing structure for word lines, bit lines, and/or voltage lines. For example, a vertical SRAM is disclosed that stacks transistors, vertically, to facilitate scaling needed for advanced IC technology nodes and improve memory performance. The vertical SRAM further includes a double-sided routing structure, which facilitates placement of bit lines, word lines, and voltage lines in a backside metal one (M1) layer and/or a frontside M1 layer to minimize line capacitance and line resistance. Different embodiments may have different advantages, and no particular advantage is required of any embodiment.

An exemplary semiconductor structure includes a metal gate, a first type channel layer, a second type channel layer, first type source/drains, and second type source/drains. The metal gate wraps the first type channel layer and the second type channel layer. The first type channel layer is disposed over the second type channel layer. The first type source/drains and the second type source/drains disposed over a substrate, and the second type source/drains are disposed over the first type source/drains. The first type channel layer is disposed between second type source/drains, and the second type channel layer is disposed between first type source/drains. The semiconductor structure further includes a first metal line disposed over a frontside of the substrate and connected to one of the second type source/drains and a second metal line disposed over a backside of the substrate and connected to one of the first type source/drains. The first metal line is connected to a first voltage, and the second metal line is connected to a second voltage different than the first voltage. In some embodiments, a dielectric layer is disposed between the first type source/drains and the second type source/drains. In some embodiments, the metal gate, the first type channel layer, and the second type source/drains form a first transistor, and the metal gate, the second type channel layer, and the first type source/drains form a second transistor. In some embodiments, the first type channel layer and the first type source/drains are n-type and the second type channel layer and the second type source/drains are p-type. In some embodiments, the first type channel layer and the first type source/drains are p-type and the second type channel layer and the second type source/drains are n-type. In some embodiments, the substrate is a dielectric layer.

In some embodiments, the semiconductor structure further includes a first source/drain contact disposed between and physically contacting the first metal line and the one of the second type source/drains and a second source/drain contact disposed between and physically contacting the second metal line and the one of the first type source/drains. In some embodiments, the one of the first type source/drains may be a first one of the first type source/drains and the one of the second type source/drains may be a first one of the second type source/drains. In such embodiments, the semiconductor structure can further include a third source/drain contact that physically contacts a second one of the first type source/drains and a second one of the second type source/drains. In some embodiments, the third source/drain contact is disposed along first sidewalls of the second one of the first type source/drains and second sidewalls of the second one of the second type source/drains. In some embodiments, the metal gate is a first metal gate. In such embodiments, the semiconductor structure can further include a third metal line disposed over the frontside of the substrate and connected to the third source/drain contact. The third metal line may further be connected to a second metal gate.

An exemplary memory includes a first transistor stack having a first transistor disposed over a second transistor, a second transistor stack having a third transistor disposed over a fourth transistor, and a fifth transistor and a sixth transistor. The first transistor stack and the second transistor stack are disposed between the fifth transistor and the sixth transistor. A word line and a first voltage line are disposed over a frontside of the first transistor stack, the second transistor stack, the fifth transistor, and the sixth transistor. The first voltage line is connected to a first voltage, the word line is connected to the fifth transistor and the sixth transistor, and the first voltage line is connected to the first transistor and the third transistor. A bit line, a bit line bar, and a second voltage line are disposed over a backside of the first transistor stack, the second transistor stack, the fifth transistor, and the sixth transistor. The second voltage line is connected to a second voltage, the bit line is connected to the fifth transistor, the bit line bar is connected to the sixth transistor, and the second voltage line is connected to the second transistor and the fourth transistor. In some embodiments, the first transistor, the second transistor, the third transistor, the fourth transistor, the fifth transistor, and the sixth transistor are formed from one active region. In some embodiments, the word line and the first voltage line are in a frontside bottommost metal line layer of a frontside routing structure of the memory, and the bit line, the bit line bar, and the second voltage line are in a backside bottommost metal line layer of a backside routing structure of the memory. In some embodiments, the frontside routing structure can further include a frontside contact layer and a frontside via layer disposed between the frontside bottommost metal line layer and the frontside of the first transistor, the second transistor, the third transistor, the fourth transistor, the fifth transistor, and the sixth transistor. In some embodiments, the backside routing structure can further include a backside contact layer disposed between the frontside bottommost metal line layer and the backside of the first transistor, the second transistor, the third transistor, the fourth transistor, the fifth transistor, and the sixth transistor.

In some embodiments, the first transistor and the second transistor share a first gate, the third transistor and the fourth transistor share a second gate, the fifth transistor has a third gate, and the sixth transistor has a fourth gate. In some embodiments, the first transistor and the third transistor share a first epitaxial source/drain feature, the second transistor and the fourth transistor share a second epitaxial source/drain feature, the second transistor and the fifth transistor share a third epitaxial source/drain feature, and the fourth transistor and the sixth transistor share a fourth epitaxial source/drain feature. In some embodiments, the first epitaxial source/drain feature is disposed over the second epitaxial source/drain feature, the first gate is disposed between the second epitaxial source/drain feature and the third epitaxial source/drain feature, and the second gate is disposed between the second epitaxial source/drain feature and the fourth epitaxial source/drain feature. In some embodiments, the third gate and the fourth gate are connected to the word line, the first epitaxial source/drain feature is connected to the first voltage line, and the second epitaxial source/drain feature is connected to the second voltage line. In some embodiments, the fifth transistor further has a fifth epitaxial source/drain feature, the third gate is disposed between the third epitaxial source/drain feature and the fifth epitaxial source/drain feature, and the fifth epitaxial source/drain feature is connected to the bit line. In some embodiments, the sixth transistor further has a sixth epitaxial source/drain feature, the fourth gate is disposed between the fourth epitaxial source/drain feature and the sixth epitaxial source/drain feature, and the sixth epitaxial source/drain feature is connected to the bit line bar.

In some embodiments, the first transistor further has a fifth epitaxial source/drain feature and the fifth epitaxial source/drain feature is disposed over the third epitaxial source/drain feature. In some embodiments, the third transistor further has a sixth epitaxial source/drain feature and the sixth epitaxial source/drain feature is disposed over the fourth epitaxial source/drain feature. In some embodiments, the first gate is further disposed between the first epitaxial source/drain feature and the fifth epitaxial source/drain feature and the second gate is further disposed between the first epitaxial source/drain feature and the sixth epitaxial source/drain feature. In some embodiments, the memory further includes a first source/drain contact disposed on the fifth epitaxial source/drain feature and the third epitaxial source/drain feature and a second source/drain contact disposed on the sixth epitaxial source/drain feature and the fourth epitaxial source/drain feature. In some embodiments, the fifth epitaxial source/drain feature is separated from the third epitaxial source/drain feature by a first dielectric layer and the sixth epitaxial source/drain feature is separated from the fourth epitaxial source/drain feature by a second dielectric layer. In some embodiments, the fifth epitaxial source/drain feature, the third epitaxial source/drain feature, and the first dielectric layer form a first epitaxial source/drain stack and the sixth epitaxial source/drain feature, the fourth epitaxial source/drain feature, and the second dielectric layer form a second epitaxial source/drain stack. In some embodiments, the first source/drain contact wraps the first epitaxial source/drain stack and the second source/drain contact wraps the second epitaxial source/drain stack.

An exemplary method includes receiving a multigate device precursor having a silicon-on-insulator (SOI) substrate, a sacrificial silicon germanium layer disposed over the SOI substrate, a sacrificial silicon layer disposed over the sacrificial silicon germanium layer, and a semiconductor layer stack disposed over the sacrificial silicon layer. The method further includes forming a first source/drain recess and a second source/drain recess that extend through the semiconductor layer stack to a depth in the sacrificial silicon layer. The first source/drain recess is for a first epitaxial source/drain structure having a frontside source/drain contact and the second source/drain recess is for a second epitaxial source/drain structure having a backside source/drain contact. The method further includes extending the second source/drain recess through the sacrificial silicon layer and the sacrificial silicon germanium layer to a depth in a silicon layer of SOI substrate. In some embodiments, forming the first epitaxial source/drain structure in the first source/drain recess and the second epitaxial source/drain structure in the second source/drain recess includes forming an undoped semiconductor layer in the second source/drain recess, where a top surface of the undoped semiconductor layer is lower than a top surface of the sacrificial silicon layer. In such embodiments, forming the first epitaxial source/drain structure in the first source/drain recess and the second epitaxial source/drain structure in the second source/drain recess can further include epitaxially growing a doped first semiconductor layer in the first source/drain recess and over the undoped semiconductor layer in the second source/drain recess, forming an insulator layer over the doped first semiconductor layer in the first source/drain recess and the second source/drain recess, and epitaxially growing a doped second semiconductor layer over the insulator layer in the first source/drain recess and the second source/drain recess. In some embodiments, the method further includes forming the frontside source/drain contact to the first epitaxial source/drain structure and the backside source/drain contact to the second epitaxial source/drain structure and replacing the sacrificial silicon layer, the sacrificial silicon germanium layer, and the SOI substrate with a dielectric substrate. In some embodiments, the method further includes forming the backside source/drain contact to the second epitaxial source/drain structure after the replacing the sacrificial silicon layer, the sacrificial silicon germanium layer, and the SOI substrate with the dielectric substrate. In some embodiments, forming the backside source/drain contact to the second epitaxial source/drain structure includes removing the undoped semiconductor layer to form a contact opening in the dielectric substrate that exposes the doped first semiconductor layer of the second epitaxial source/drain structure and depositing a conductive material in the contact opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a metal gate that wraps a first type channel layer and a second type channel layer, wherein the first type channel layer is disposed over the second type channel layer;
first type source/drains and second type source/drains disposed over a substrate, wherein the second type source/drains are disposed over the first type source/drains, the first type channel layer is disposed between the second type source/drains, and the second type channel layer is disposed between the first type source/drains;
a first metal line disposed over a frontside of the substrate and connected to one of the second type source/drains, wherein the first metal line is connected to a first voltage; and
a second metal line disposed over a backside of the substrate and connected to one of the first type source/drains, wherein the second metal line is connected to a second voltage that is different than the first voltage.

2. The semiconductor structure of claim 1, further comprising a dielectric layer disposed between the first type source/drains and the second type source/drains.

3. The semiconductor structure of claim 1, wherein:
the metal gate, the first type channel layer, and the second type source/drains form a first transistor; and
the metal gate, the second type channel layer, and the first type source/drains form a second transistor.

4. The semiconductor structure of claim 1, wherein the first type channel layer and the first type source/drains are n-type and the second type channel layer and the second type source/drains are p-type.

5. The semiconductor structure of claim 1, wherein the first type channel layer and the first type source/drains are p-type and the second type channel layer and the second type source/drains are n-type.

6. The semiconductor structure of claim 1, wherein the substrate is a dielectric layer.

7. The semiconductor structure of claim 1, further comprising:

a first source/drain contact disposed between and physically contacting the first metal line and the one of the second type source/drains; and a second source/drain contact disposed between and physically contacting the second metal line and the one of the first type source/drains.

8. The semiconductor structure of claim 7, wherein the one of the first type source/drains is a first one of the first type source/drains and the one of the second type source/drains is a first one of the second type source/drains, and wherein the semiconductor structure further comprises:

a third source/drain contact that physically contacts a second one of the first type source/drains and a second one of the second type source/drains.

9. The semiconductor structure of claim 8, wherein the third source/drain contact is disposed along first sidewalls of the second one of the first type source/drains and second sidewalls of the second one of the second type source/drains.

10. The semiconductor structure of claim 8, wherein the metal gate is a first metal gate, the semiconductor structure further comprising a third metal line disposed over the frontside of the substrate and connected to the third source/drain contact, wherein the third metal line is further connected to a second metal gate.

11. A memory comprising:

a first transistor stack having a first transistor disposed over a second transistor;

a second transistor stack having a third transistor disposed over a fourth transistor;

a fifth transistor and a sixth transistor, wherein the first transistor stack and the second transistor stack is disposed between the fifth transistor and the sixth transistor;

a word line and a first voltage line disposed over a frontside of the first transistor stack, the second transistor stack, the fifth transistor, and the sixth transistor, wherein the first voltage line is connected to a first voltage, the word line is connected to the fifth transistor and the sixth transistor, and the first voltage line is connected to the first transistor and the third transistor; and a bit line, a bit line bar, and a second voltage line disposed over a backside of the first transistor stack, the second transistor stack, the fifth transistor, and the sixth transistor, wherein the second voltage line is connected to a second voltage, the bit line is connected to the fifth transistor, the bit line bar is connected to the sixth transistor, and the second voltage line is connected to the second transistor and the fourth transistor.

12. The memory of claim 11, wherein the first transistor, the second transistor, the third transistor, the fourth transistor, the fifth transistor, and the sixth transistor are formed from one active region.

13. The memory of claim 11, wherein:

the word line and the first voltage line are in a frontside bottommost metal line layer of a frontside routing structure of the memory; and the bit line, the bit line bar, and the second voltage line are in a backside bottommost metal line layer of a backside routing structure of the memory.

14. The memory of claim 13, wherein:

the frontside routing structure further includes a frontside contact layer and a frontside via layer disposed between the frontside bottommost metal line layer and the frontside of the first transistor stack, the second transistor stack, the fifth transistor, and the sixth transistor; and the backside routing structure further includes a backside contact layer disposed between the backside bottommost metal line layer and the backside of the first transistor stack, the second transistor stack, the fifth transistor, and the sixth transistor.

15. The memory of claim 11, wherein:

the first transistor and the second transistor share a first gate, the third transistor and the fourth transistor share a second gate, the fifth transistor has a third gate, and the sixth transistor has a fourth gate;

the first transistor and the third transistor share a first epitaxial source/drain feature, the second transistor and the fourth transistor share a second epitaxial source/drain feature, the second transistor and the fifth transistor share a third epitaxial source/drain feature, and the fourth transistor and the sixth transistor share a fourth epitaxial source/drain feature;

wherein the first epitaxial source/drain feature is disposed over the second epitaxial source/drain feature, the first gate is disposed between the second epitaxial source/drain feature and the third epitaxial source/drain feature, and the second gate is disposed between the second epitaxial source/drain feature and the fourth epitaxial source/drain feature; and wherein the third gate and the fourth gate are connected to the word line, the first epitaxial source/drain feature is connected to the first voltage line, and the second epitaxial source/drain feature is connected to the second voltage line.

16. The memory of claim 15, wherein:

the fifth transistor further has a fifth epitaxial source/drain feature, wherein the third gate is disposed between the third epitaxial source/drain feature and the fifth epitaxial source/drain feature and the fifth epitaxial source/drain feature is connected to the bit line; and the sixth transistor further has a sixth epitaxial source/drain feature, wherein the fourth gate is disposed between the fourth epitaxial source/drain feature and the sixth epitaxial source/drain feature and the sixth epitaxial source/drain feature is connected to the bit line bar.

17. The memory of claim 15, wherein:

the first transistor further has a fifth epitaxial source/drain feature, wherein the fifth epitaxial source/drain feature is disposed over the third epitaxial source/drain feature;

the third transistor further has a sixth epitaxial source/drain feature, wherein the sixth epitaxial source/drain feature is disposed over the fourth epitaxial source/drain feature;

the first gate is further disposed between the first epitaxial source/drain feature and the fifth epitaxial source/drain feature and the second gate is further disposed between the first epitaxial source/drain feature and the sixth epitaxial source/drain feature; and the memory further includes a first source/drain contact disposed on the fifth epitaxial source/drain feature and the third epitaxial source/drain feature and a second source/drain contact disposed on the sixth epitaxial source/drain feature and the fourth epitaxial source/drain feature.

18. The memory of claim 17, wherein:

the fifth epitaxial source/drain feature is separated from the third epitaxial source/drain feature by a first dielectric layer;

the sixth epitaxial source/drain feature is separated from the fourth epitaxial source/drain feature by a second dielectric layer;

the fifth epitaxial source/drain feature, the third epitaxial source/drain feature, and the first dielectric layer form a first epitaxial source/drain stack;

the sixth epitaxial source/drain feature, the fourth epitaxial source/drain feature, and the second dielectric layer form a second epitaxial source/drain stack; and the first source/drain contact wraps the first epitaxial source/drain stack and the second source/drain contact wraps the second epitaxial source/drain stack.

19. A device, comprising:
a transistor stack having a first transistor disposed over a second transistor, wherein:
  the first transistor has a first channel layer disposed between first source/drains, wherein the first channel layer is of a first type and the first source/drains are of a second type that is different than the first type,
  the second transistor has a second channel layer of the second type disposed between second source/drains of the first type, wherein the first channel layer is disposed over the second channel layer and the first source/drains are disposed over the second source/drains, and
  the first transistor and the second transistor have a common gate that wraps the first channel layer and the second channel layer;
a frontside routing line connected to one of the first source/drains, wherein the frontside routing line is connected to a first voltage; and
a backside routing line connected to one of the second source/drains, wherein the backside routing line is connected to a second voltage that is different than the first voltage.

20. The device of claim 19, wherein:
the transistor stack is a first transistor stack, the common gate is a first common gate, the frontside routing line is a first frontside routing line, and the backside routing line is a first backside routing line; and the device further includes:
  a second transistor stack having a third transistor disposed over a fourth transistor, wherein:
    the third transistor has a third channel layer disposed between third source/drains, wherein the third channel layer is of the first type and the third source/drains are of the second type,
    the fourth transistor has a fourth channel layer of the second type disposed between fourth source/drains of the first type, wherein the third channel layer is disposed over the fourth channel layer and the third source/drains are disposed over the fourth source/drains, and
    the third transistor and the fourth transistor have a second common gate that wraps the third channel layer and the fourth channel layer;
  a second frontside routing line connected to the second common gate, wherein the second frontside routing line is connected to a third voltage; and
  a second backside routing line connected to one of the fourth source/drains, wherein the second backside routing line is connected to a fourth voltage that is different than the third voltage.

\* \* \* \* \*